United States Patent
Saeki et al.

(12) 
(10) Patent No.: US 6,335,882 B1
(45) Date of Patent: Jan. 1, 2002

(54) NONVOLATILE SEMICONDUCTOR MEMORY DEVICE CAPABLE OF ERASING BLOCKS DESPITE VARIATION IN ERASING CHARACTERISTIC OF SECTORS

(75) Inventors: Tatsuya Saeki; Hiroaki Nakai, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/709,466

(22) Filed: Nov. 13, 2000

(30) Foreign Application Priority Data

May 12, 2000 (JP) .......................................... 12-140527

(51) Int. Cl.$^7$ ................................................ G11C 7/00
(52) U.S. Cl. .............................. 365/185.29; 365/185.11; 365/185.02; 365/185.18; 365/185.24; 365/185.3
(58) Field of Search ........................ 365/185.29, 185.02, 365/185.11, 185.18, 185.24, 185.3

(56) References Cited

U.S. PATENT DOCUMENTS

| | | | | |
|---|---|---|---|---|
| 5,805,510 A | * | 9/1998 | Miyakawa et al. .... | 365/185.11 |
| 5,982,668 A | * | 11/1999 | Ishii et al. ............. | 365/185.24 |
| 6,078,519 A | * | 6/2000 | Kanamitsu et al. .... | 365/185.03 |
| 6,094,373 A | * | 7/2000 | Saito ..................... | 365/185.22 |
| 6,222,779 B1 | * | 4/2001 | Saito et al. ............ | 365/189.09 |
| 6,236,609 B1 | * | 5/2001 | Tanzawa et al. ........... | 365/218 |
| 6,262,926 B1 | * | 7/2001 | Nakai .......................... | 365/200 |

FOREIGN PATENT DOCUMENTS

JP          6-28875          2/1994

* cited by examiner

*Primary Examiner*—Viet Q. Nguyen
(74) *Attorney, Agent, or Firm*—McDermott, Will & Emery

(57) ABSTRACT

A power generating portion generates an erasing potential for an erasing operation with respect to information stored in a memory cell and variably generates a first potential applied to the selected memory cell and a second potential applied to the non-selected memory cell during a reading operation. A chip control portion selectively applies an erasing potential to every block to be erased. At the time, the chip control portion applies the first potential to any one of sectors in the block to be erased and also applies the second potential, which has been updated such that none of the memory cells belonging to the block to be erased is conductive, to the remaining sectors in the block to be erased for performing an erasing verify operation.

13 Claims, 24 Drawing Sheets

SIMULTANEOUSLY
ERASE 8 SECTORS

SIMULTANEOUSLY
WRITING TO 8 SECTORS

NONVOLATILE SEMICONDUCTOR MEMORY DEVICE CAPABLE OF ERASING BLOCKS DESPITE VARIATION IN ERASING CHARACTERISTIC OF SECTORS

BACKGROUND OF THE INVENTION

1. Field of the Invention

The present invention relates to a structure of a nonvolatile semiconductor memory device capable of writing/erasing electrical data and storing information even when a power supply source is turned off.

2. Description of the Background Art

A nonvolatile semiconductor memory device, e.g., a flash memory, has a memory cell array with memory cell transistors having floating gates arranged. The flash memory can electrically write/erase data of the memory cells. Recently, such flash memories are widely used for a data storage application of temporarily storing data in a nonvolatile manner in a system such as a digital still camera, digital audio, and flash card.

In the flash memory, a writing/erasing operation is performed by applying a high voltage to a floating gate which is insulated by an insulation film from a periphery portion in the memory cell transistor to charge or discharge electrons so that the threshold voltage of the memory cell transistor is changed. In the flash memory used for the data storage application, unlike in the conventional application of retaining a program for operating a system, for example, a data unit (the number of memory cells that are collectively processed) not only to be written but also to be erased is desirably small because the writing operation per se must be frequently performed.

FIG. 22 is a schematic block diagram showing an arrangement of a memory cell array of an AND flash memory.

A memory cell MC001 is a floating gate type transistor having a gate, drain and source. Memory cell MC001 has its gate connected to a word line WL(0), its drain connected to a global bit line GBL1 through a sub bit line SBL and a select transistor STR1, and its source connected to a source line SL through a select transistor STR2. 128 memory cells are connected to sub bit line SBL, and 128 word lines form one physical unit. This is referred to as "a physical block."

The writing/erasing operation with respect to the memory cells is usually performed on every word line (hereinafter referred to as "one sector"). The writing operation is performed by applying a positive high voltage (of for example 18 V) to a word line to increase the threshold value of the memory cell.

It is noted that a positive writing preventing voltage (of for example 6 V) is applied to the memory cells to which data is not to be written so as to prevent increase in the threshold value.

The erasing operation is performed by applying a negative high voltage (of for example −17 V) to the word line to decrease the threshold value of the floating gate transistor forming the memory cells.

The writing/erasing operation is automatically performed by a control circuit in the flash memory. In the automatic erasing operation, an operation of determining as to if the memory cell has attained to a threshold value in a desired range (hereinafter referred to as "a verify operation"), such as an operation of applying an erasing pulse to a target sector, is repeated. Then, the operation is stopped when the threshold values of all memory cells fall in the desired range, and the completion of the erasing operation is notified to an external system.

When the system requests writing of a data unit greater than one sector, the writing time can be reduced by performing the automatic erasing operation simultaneously on a plurality of sectors. The automatic erasing for every sector is referred to as "sector erasing," whereas the automatic erasing performed simultaneously on the plurality of sectors is referred to as "block erasing."

FIG. 23 is a graph showing a relationship between a threshold value distribution of the memory cell transistors in a block (a plurality of sectors) to be erased and a verify voltage.

FIG. 24 is a flow chart showing an exemplary operation of the block erasing (when one block includes 8 sectors).

Referring to FIGS. 23 and 24, when the block erasing operation is started (a step S1000), a sector address is reset such that AX=0 (a step S1002).

Thereafter, erasing pulses are applied collectively to eight sectors (a step S1004) and, successively, a determination is made as to if the threshold voltages of the memory cells in the first sector have become for example equal to or smaller than 1.6 V (hereinafter indicated as VF1) (this operation is hereinafter referred to as "erasing verify") (a step S1006).

If it is determined that the threshold voltage has not become equal to or smaller than a potential VF1 as a result of the erasing verify, a process returns to step S1004. Such pulse application and erasing verify are repeated. If it is determined that the threshold voltages of all memory cells in the first sector have become equal to or smaller than potential VF1 (1.6 V) (a step S1006), a determination is made as to if an erasing operation on eight sectors has been completed (a step S1008).

If it is determined that the process on eight sectors has not yet been completed, the sector address is incremented (a step S1010), and step S1006 is performed on the second sector, so that a verify operation is performed as in the case of the first sector.

If it is determined that the erasing verify has been performed on all of the eight sectors in a step S1008, the sector address is reset again (a step S1012).

Thereafter, an operation of checking as to if there is any memory cell of which threshold voltage has become too low (hereinafter referred to as "over-erasing verify") (a step S1014).

If it is determined that the threshold voltage has become too low as a result of the over-erasing verify operation (step S1014), a writing operation is selectively performed on the memory cell that has failed the over-erasing verify, i.e., the memory cell of which threshold voltage has become equal to or smaller than 0.9 V (hereinafter indicated as VF2) (a step S1012).

A determination is made as to if the threshold voltage has increased at least to potential VF2 by the above mentioned selectively performed writing operation (a step S1022) and, if the threshold value has not increased at least to potential VF2, the selectively performed writing process performed again (step S1020). On the other hand, if it is determined that the threshold voltage has become at least potential VF2 (step S1022), it is again verified as to if there is any cell of which threshold value has become at least 1.9 V (hereinafter indicated as VF3) (this operation is hereinafter referred to as "over-writing verify") (step S1024).

If it is determined that the threshold value is at least potential VF2 and at most potential VF3 as a result of the over-writing verify, the process proceeds to a step S1016.

Meanwhile, the process also proceeds to step S1016 even if it is determined that the threshold voltage is not at most potential VF2 as a result of the over-erasing verify in step S1014.

A determination is made as to if the over-erasing verify has been performed on eight sectors in step S1016 and, if the process on the eight sectors has not yet been completed, the sector address is incremented (step S1018) and the process returns to the step of the over-erasing verify (step S1014).

If it is determined that the process on the eight sectors has been completed (step S1016), the erasing operation normally ends (a step S1030).

In the step S1024, if the overwriting verify reveals that the threshold value exceeds the potential VF3 as a result of the overwriting caused by the writing verify so performed that the threshold values are rendered above the potential VF2, the erasing operation abnormally ends (step S1026)

In the erasing verify operation, as shown in FIG. 22, the voltage of the selected word line of the sector to be subjected to the erasing verify is set such that VF1=1.6 V, whereas the voltage of the non-selected word lines of other sectors is set such that VF0=−2 V.

The global bit line is precharged to about 1 V. When select transistors STR1 and STR2 are turned on, electric charges are discharged from the bit line if the threshold value of the memory cells of the target sector is at most potential VF1.

However, if any memory cell comes to have a threshold voltage of at most potential VF0 other than that in the sector to be verified by simultaneous application of erasing pulses to a plurality of sectors, that cell is always maintained in an on state even if the word line voltage VF0 equals to −2 V (the state is hereinafter referred to as "a deplete state"). Thus, even if the threshold voltage of the memory cells of the sector to be subjected to the erasing verify is at least VF1, the result of the erasing verify turns out to be "pass" because it seems apparently normal.

FIG. 25 is a graph showing a distribution of threshold voltages when an erasing voltage is applied to one sector, where a distribution width is assumed for example 2 V in average.

FIG. 26 is a graph showing a distribution of threshold values for every block after block erasing is performed on a plurality of sectors.

In block erasing, if a variation in erasing characteristics of sectors is large and a distribution of the threshold values is at least 1.6 V as shown in FIG. 26, a memory cell in a deplete state is caused, whereby the erasing verify cannot be normally performed as described above.

FIG. 27 is a diagram shown in conjunction with a path of a current leaking from a global bit line during erasing verify due to the above mentioned memory cell in the deplete state.

Referring to FIG. 27, since a memory cell MC002 is in the deplete state, the potential of word line WL(0) corresponding to a target sector is VF1. Thus, even if the potential of word line WL(1) corresponding to the non-target sector is VF0 (−2 V), memory cell MC002 is rendered conductive.

Accordingly, even if the threshold level of memory cell MC001 is higher than VF1, electric charges flow from global bit line BL, so that the threshold level of memory cell MC001 is determined, apparently as being lower than VF1.

As described above, although non-selected word line voltage VF0 during erasing verify is for example −2 V, if non-selected word line voltage VF is further reduced, a voltage stress (hereinafter referred to as "disturb") close to the voltage applied to the memory cell during erasing is applied to the non-selected memory cell transistors. Thus, it is desired that a decrease in potential VF0 is minimized.

A possible method may be to decrease voltage VF0 of the non-selected word line only for the sector in the block to be erased of physical blocks. However, the structure and operation of the circuit may disadvantageously become complicated if two potentials VF0 are set within the same physical block.

SUMMARY OF THE INVENTION

An object of the present invention is to provide a nonvolatile semiconductor memory device capable of normally performing block erasing and minimizing an adverse affect of disturb despite a variation in erasing characteristics of sectors.

In short, the present invention is a nonvolatile semiconductor device including a memory cell array, a plurality of bit lines, a plurality of word lines, a data detection circuit, an internal power supply circuit, a selection circuit, and an internal control circuit.

The memory cell array includes a plurality of memory cells arranged in a matrix. Each memory cell includes a memory cell transistor capable of changing a threshold value in accordance with an applied control potential.

The plurality of bit lines are arranged corresponding to columns of the memory cell array for transmitting data stored in the memory cell transistors. The plurality of word lines are arranged corresponding to rows of the memory cell array for transmitting a control potential and reading potential to the memory cell transistors.

The data detection circuit detects stored data which has been read out through the bit line.

The internal power supply circuit can generate a control potential for an erasing operation on stored data of the memory cell and variably generate a first potential to be applied to selected memory cell and a second potential to be applied to the non-selected memory cell during the reading operation.

The selection circuit selectively supplies the potential generated by the internal power supply circuit to the memory cell.

The internal control circuit can control the operation of the nonvolatile semiconductor memory device and the selection circuit for selectively applying the control potential to the block to be erased. The block to be erased includes a plurality of memory cells connected to a prescribed number of word lines of the plurality of word lines.

The internal control circuit applies the first potential to any one of word lines in the block to be erased and also applies the second potential, which has been updated such that none of a plurality of memory cells belonging at least to the block to be erased is conductive, to the remaining word lines in the block to be erased for verifying erasing based on the detection result of the data detection circuit.

Accordingly, advantage of the present invention is that erasing verify can be normally performed even if there is a depleted cell since a potential of at most a threshold value of the depleted memory cell transistor is applied to the non-selected word line. In addition, since the voltage of the non-selected word line is decreased only when there is a depleted cell, the device is disturbed for a less amount of time than when the non-selected word line is initially set at a low voltage during erasing verify.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
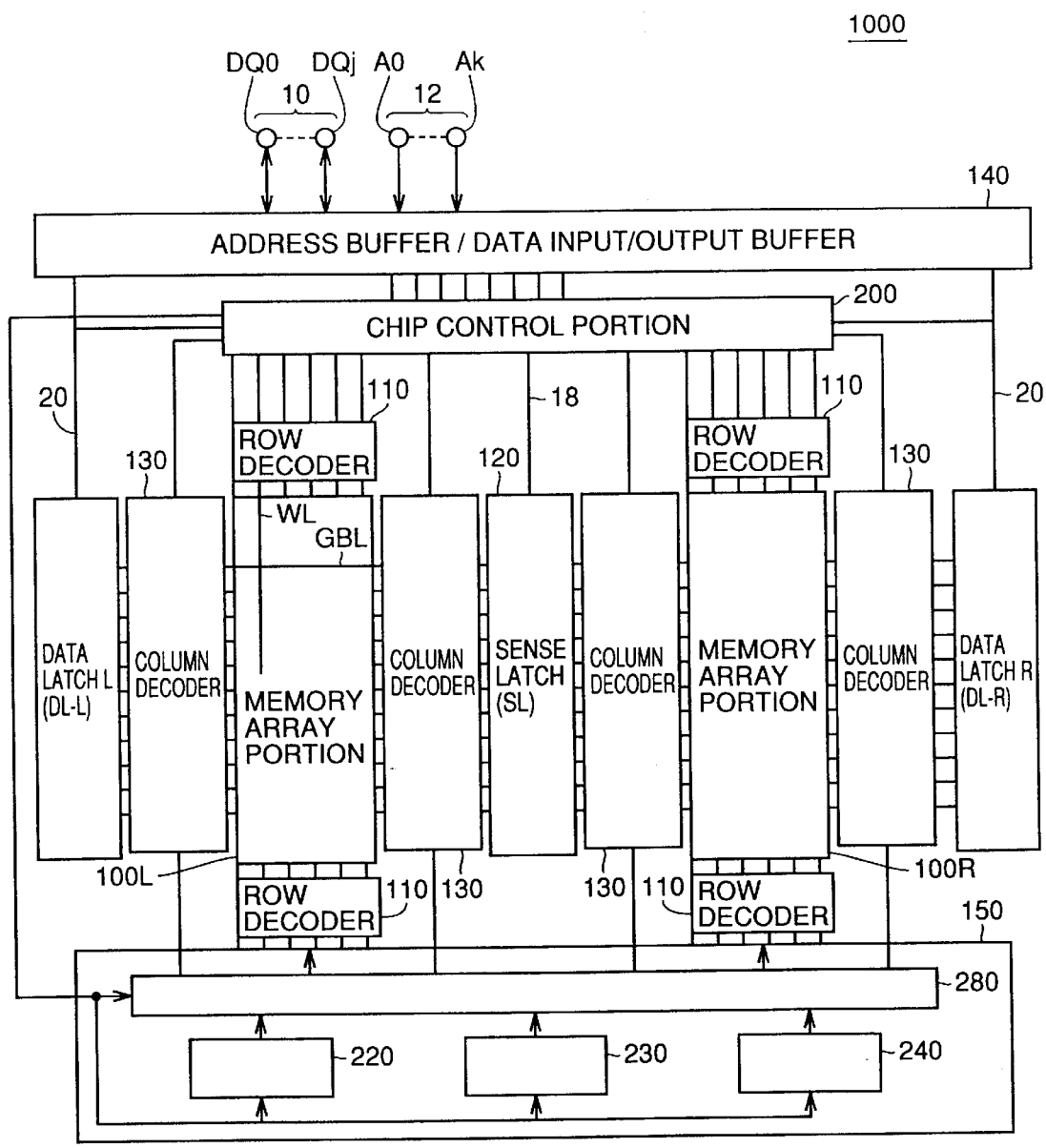
FIG. 1 is a schematic block diagram showing an overall arrangement of an AND flash memory 1000 of the present invention.

FIG. 1 is a schematic block diagram showing an overall arrangement of an AND flash memory 1000 of the present invention.

A memory cell array 100 includes a plurality of memory cells each including a floating gate and a control gate. Referring to FIG. 1, memory cell array 100 is divided into two memory cell blocks 100R and 100L.

The control gate of the memory cell is connected to a word line WL. The memory cell has its drain connectable to global bit line GBL through a sub bit line SBL (not shown) and its source connectable to a source line SL (not shown).

One word line WL and one global bit line GBL are typically depicted. A row decoder 110 selectively drives the word line in accordance with an externally applied address signal. A sense latch circuit 120 is provided on the side of one end of bit line BL. Bit line BL is selected in accordance with a select signal output from a column decoder 130, and read data and write data are transmitted through the selected bit lines.

In FIG. 1, while not shown, sense latch circuit 120 includes a column switch circuit for selecting bit lines in accordance with a select signal from column decoder 130.

Address signals are applied to column decoder 130 and row decoder 110 from an address buffer 140.

A chip control portion 200 externally receives an access control signal, a clock signal or the like (not shown) for generally controlling the internal circuit of the flash memory for controlling writing/reading of the memory cell in accordance therewith. The operation voltage of for example a word driver (not shown) which drives the potential of the word line is changed as a chip control portion 200 controls a power generating portion 150 in accordance with an operation mode such as an erasing mode, writing mode, reading mode or the like.

Data latch circuits DL-L and DL-R are data buffers which temporarily retain transmitted data in data writing and reading operations.

While not particularly limited, the operation mode of the flash memory is supported by an access control signal externally supplied to a chip control portion 200 or command data supplied through a data bus, and has a mode of writing data (erasing and writing) or a mode of reading data.

Power generating portion 150 includes: a boosting circuit 220 receiving an external power supply voltage Vcc and a ground potential Vss for generating a positive high voltage applied to a word line in a writing operation; a negative voltage generation circuit 230 generating a negative high voltage applied to the word line in an erasing operation; a verify voltage generation circuit 240 generating a potential applied to the word line during verify operation; and a distributor 280 for selectively supplying a potential generated by power generating portion 150 to a row decoder 110, column decoder 130 and the like.

It is noted that boosting circuit 220 can be structured to generate a positive high voltage (of for example 18 V) or writing preventing voltage (of for example 6 V) applied to the word line during the writing operation in accordance with an output from a charge pump circuit (not shown).

Further, verify voltage generation circuit 240 changes the potential to be output under control of chip control portion 200.

Flash memory 1000 can selectively perform selector erasing and block erasing under control of chip control portion 200.

Figure 2:
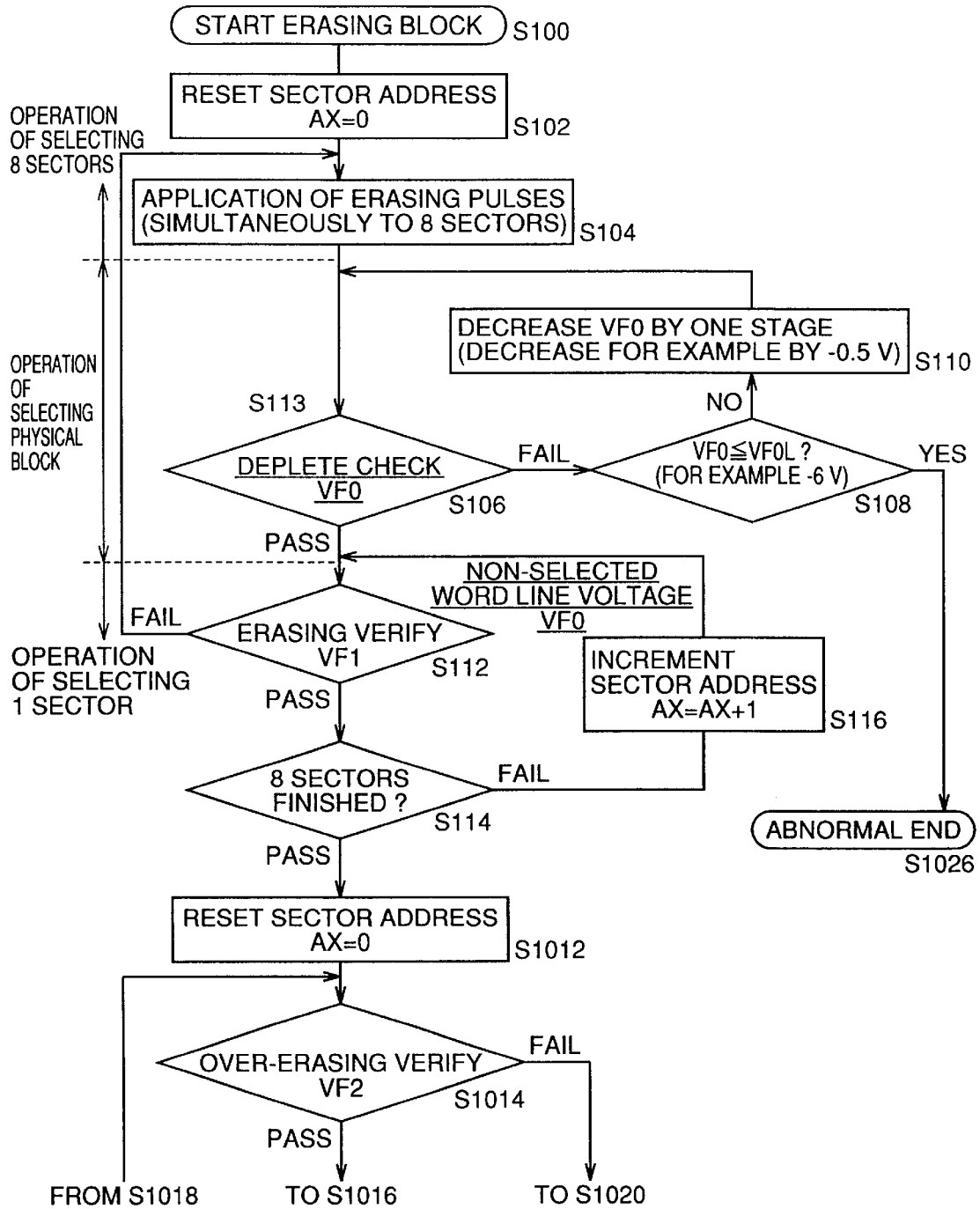
FIG. 2 is a flow chart shown in conjunction with the operation of block erasing of flash memory 1000.

FIG. 2 is a flow chart shown in conjunction with an operation of erasing the block of flash memory 1000 of FIG. 1.

As will be described in the following, in flash memory 1000, the voltage of the non-selected word line during erasing verify which is output from power generating portion 150 under control of chip control portion 200 can be set at a suitable value.

Note that the following description is on the assumption that the block to be erased has eight sectors. However, the present invention is not limited to this and the greater or smaller number of sectors can be included in the block to be erased.

Referring to FIG. 2, when a block erasing operation is started (a step S100), a sector address is reset (a step S102).

Thereafter, an erasing pulse generated by power generating portion 150 is applied to the word line with respect to eight sectors under control of chip control portion 200 (a step S104).

Then, in a physical block, a determination is made as to if there is any memory cell of which threshold value has become equal to or lower than potential VF0, which is a voltage of the non-selected word line during erasing verify. Namely, a determination is made as to if there is any memory cell in a deplete state (this is hereinafter referred to as "deplete check").

Figure 3:
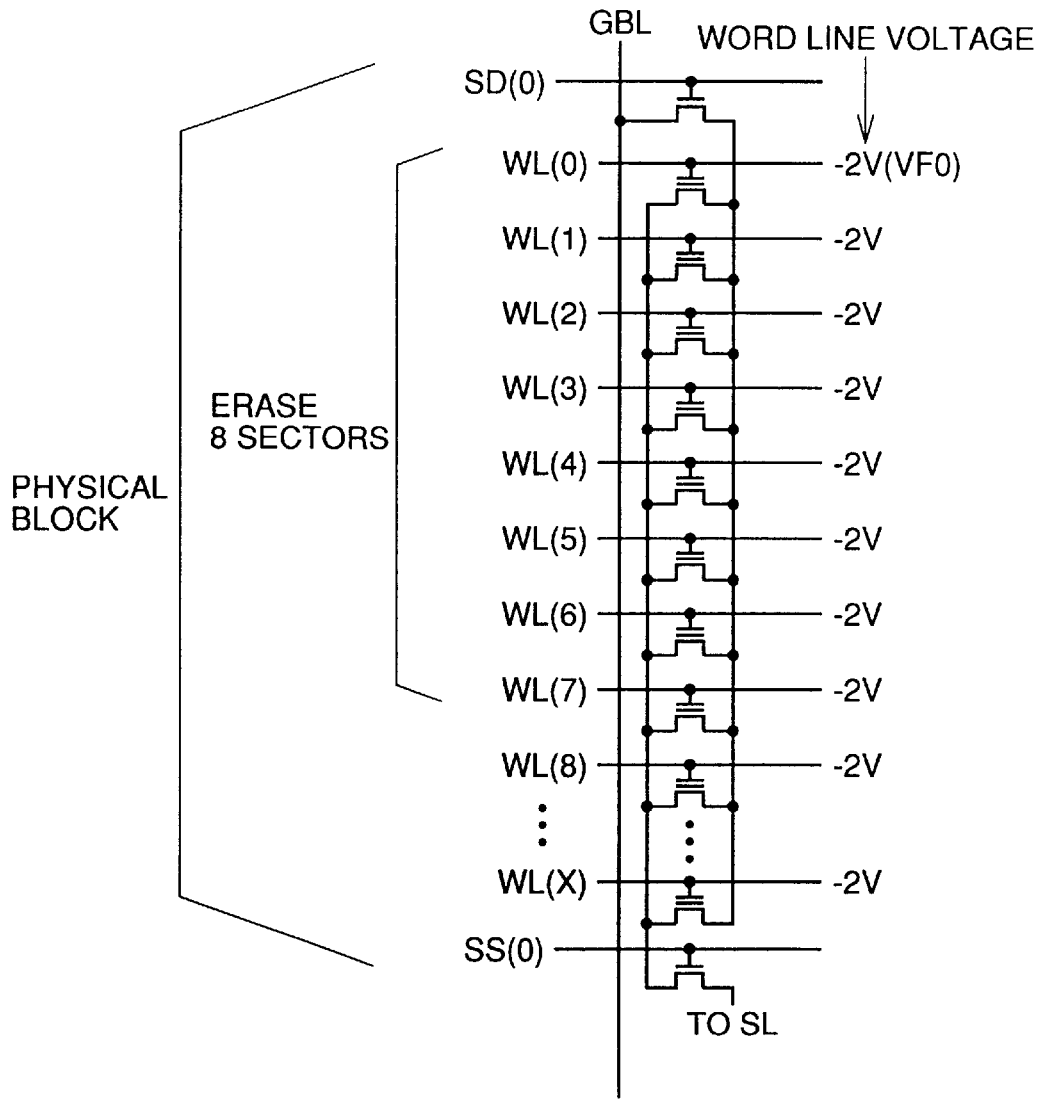
FIG. 3 is a schematic diagram shown in conjuction with the voltage of the word line to be applied to the word line in a physical block during deplete check.

More specifically, potential VF0 from power generating portion 150 is applied to all word lines in the physical block under control of chip control portion 200. FIG. 3 is a schematic diagram shown in conjunction with the voltage of the word line to be applied to the word lines in the physical block during such deplete check.

Referring to FIG. 3, the potential level of all word lines is set at −2 V. When electric charges are not discharged from all global bit lines GBL which have been precharged and it is determined by a sense amplifier of a sense latch portion 120 that there is no change in potential, the deplete check is not performed on the sector to be erased.

Figure 24:
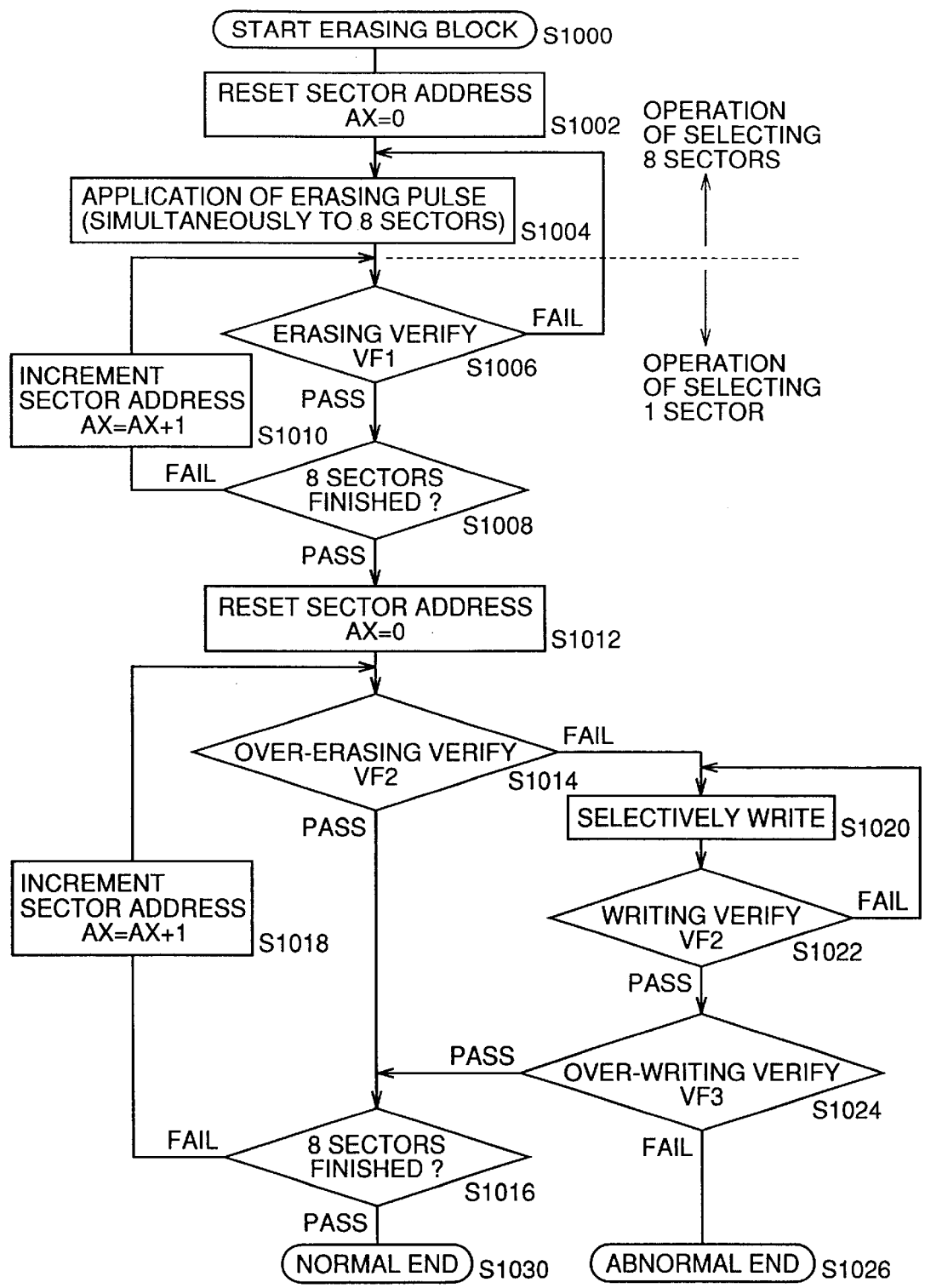
FIG. 24 is a flow chart showing an exemplary operation of erasing a block (when one block includes eight sectors).
Figure 25:
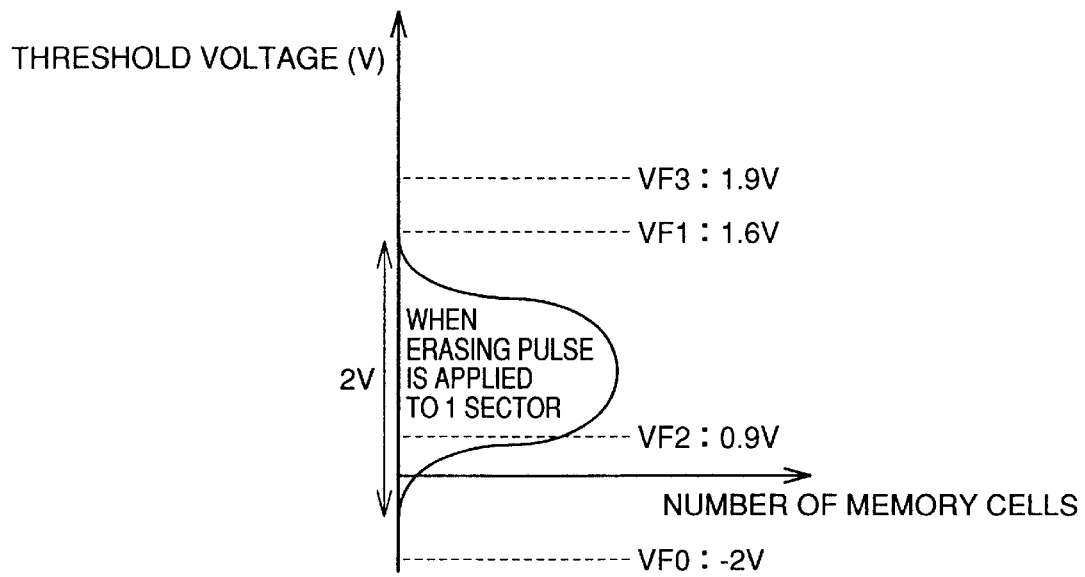
FIG. 25 is a graph showing a distribution of threshold voltages when an erasing voltage is applied to one sector.
Figure 26:
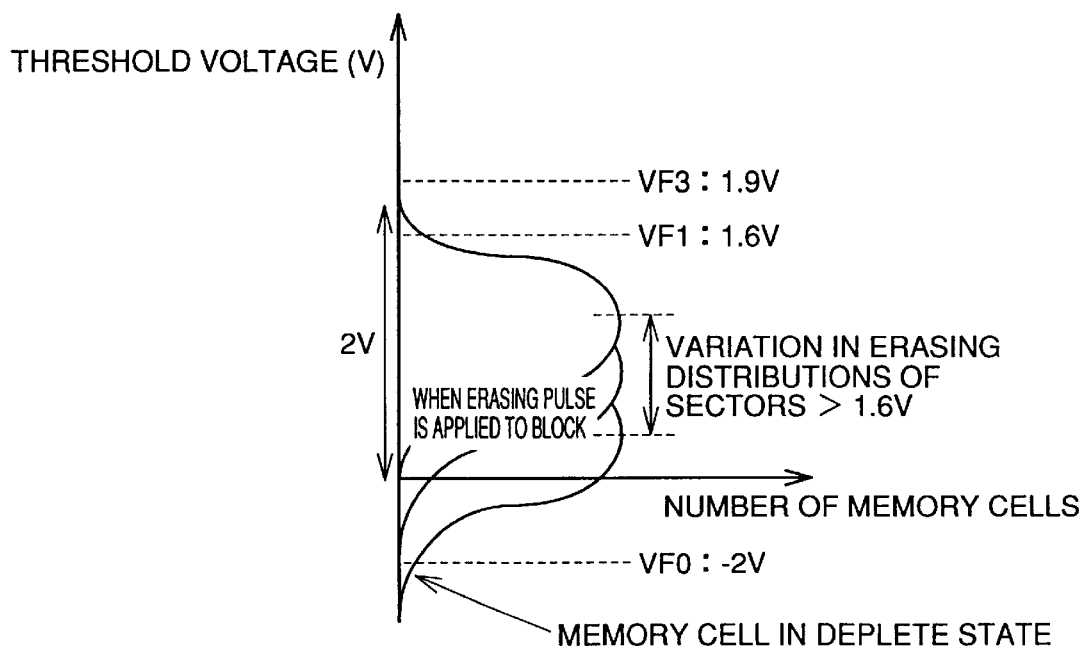
FIG. 26 is a graph showing a distribution of threshold values of blocks after block erasing is performed on a plurality of sectors.
Figure 27:
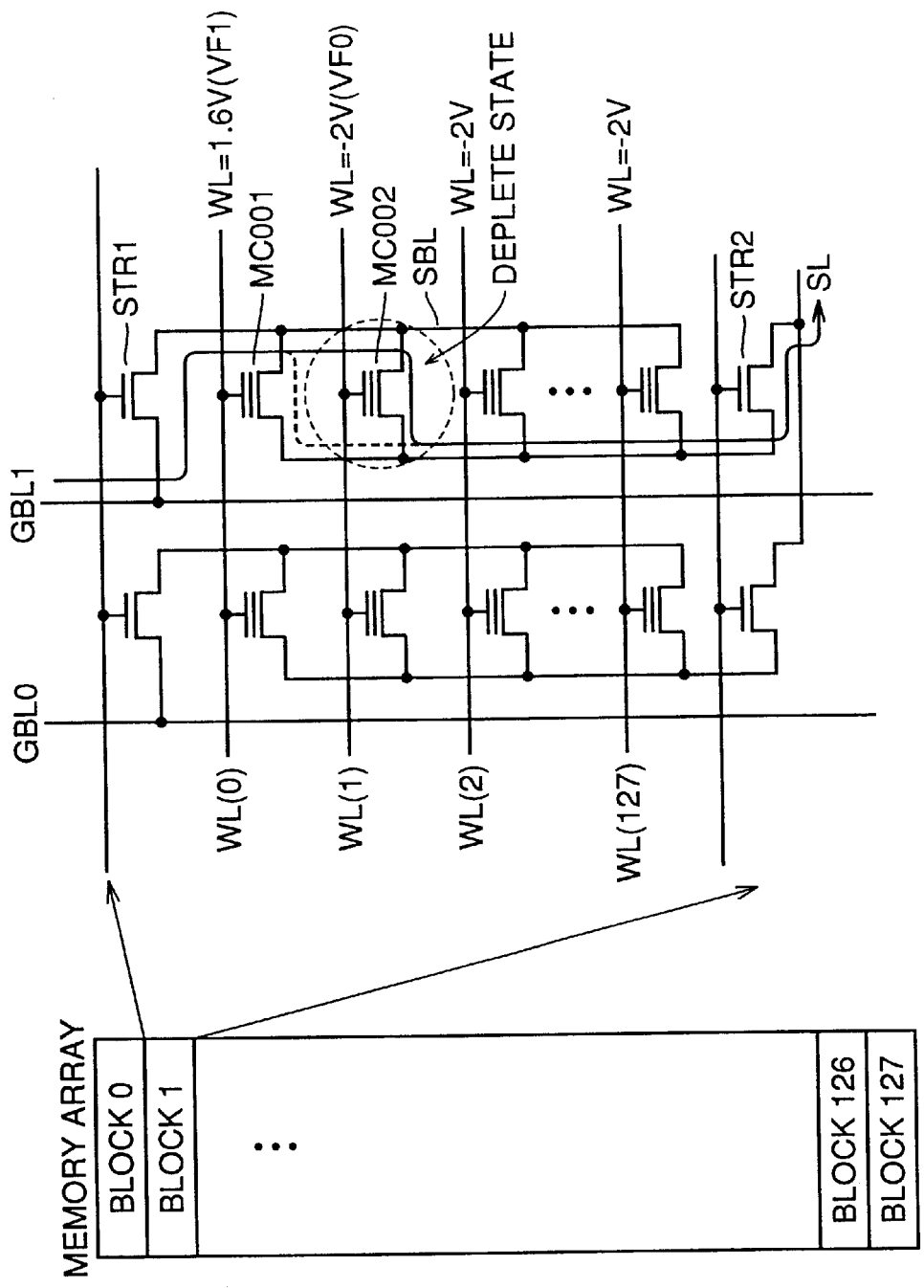
FIG. 27 is a diagram shown in conjunction with a path of a current leaking from the global bit line during erasing verify.

Accordingly, returning to FIG. 2, an erasing verify operation similar to that described with reference to FIG. 24 is performed (a step S112).

On the other hand, when there is a depleted memory cell in the block to be erased of eight sectors, the result of the deplete check turns out to be "fail." Then, a determination is made as to if potential VF0 has become equal to or smaller than VF0L, which is the lowest potential to be applied to the non-selected word line in the deplete check (a step S108).

In step S108, if potential VF0 has not become equal to or smaller than VF0L which is the lowest potential, chip control portion 200 controls a verify potential generation circuit included in power generating portion 150 to decrease the set value of potential VF0 by a prescribed value of for example −0.5 V from −2 V for repeating the deplete check again (a step S106).

If potential VF0 is reset at a potential equal to or smaller than the lowest potential VF0L of the voltage to be applied to the non-selected word line in step S108, the process abnormally ends determining that there is a depleted cell at the lowest value VF0L (a step S1026).

Here, potential VF0 of only the non-selected word line in the same physical block as the eight sectors to which erasing pulse is applied (hereinafter referred to as a selected physical block) is changed, and the word lines in all the other physical blocks are maintained at −2 V.

Figure 4:
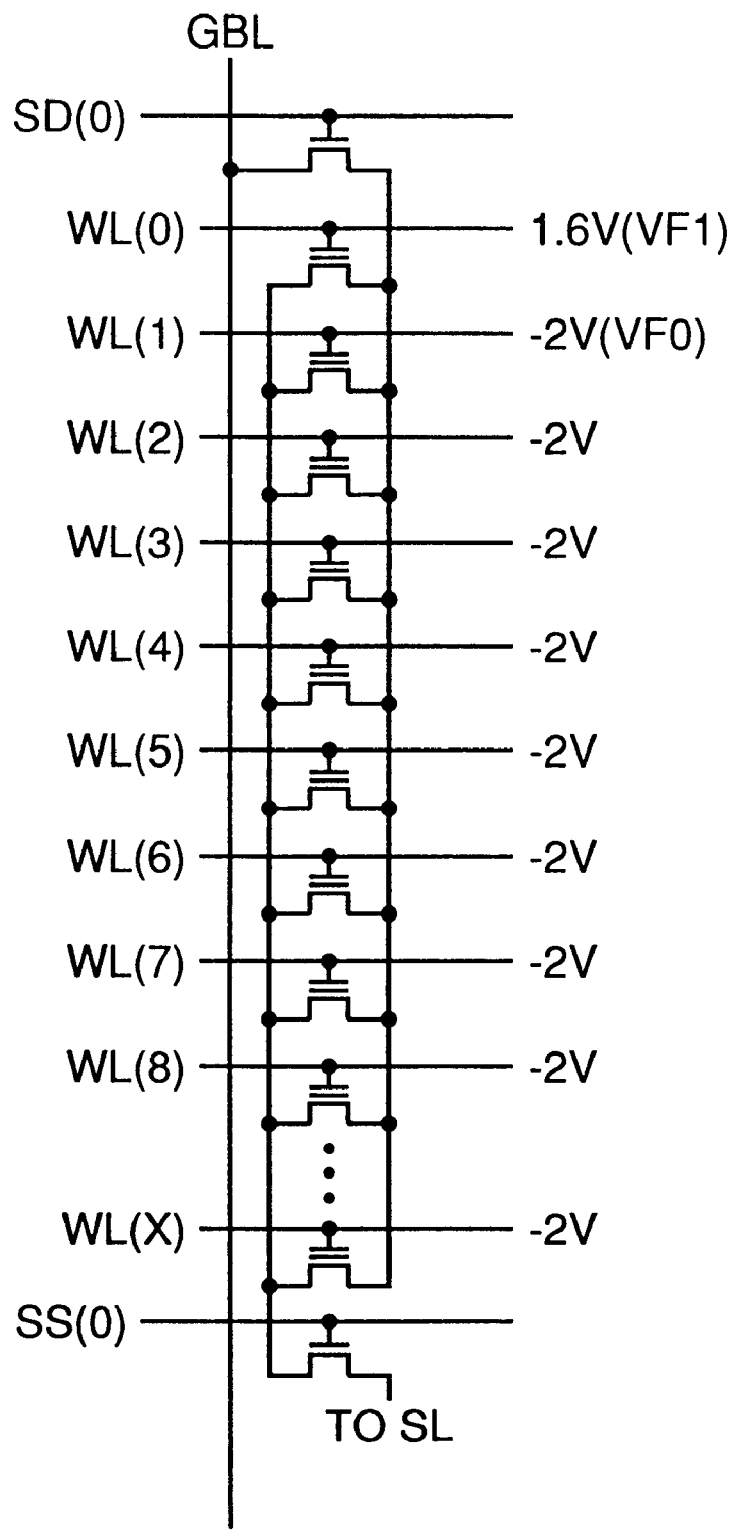
FIG. 4 is a schematic diagram shown in conjuction with the level of a potential to be applied to each word line in the physical block during erasing verify operation when it is determined there is no memory cell in a deplete state.

FIG. 4 is a schematic diagram shown in conjunction with the level of a potential to be applied to each word line in the physical block in the erasing verify operation (step S112) when it is determined that there is no memory cell in the deplete state in the block to be erased by the above described deplete check.

Referring to FIG. 4, since voltage VF0 of the non-selected word line has not been reset, when the erasing verify operation is performed on word line WL(0), only the potential level of word line WL(0) is made equal to an erasing verify voltage VF1 (1.6 V) and VF0 of −2 V, which is an initial value of the voltage of the non-selected word line, is applied to word lines WL(1) to WL(X).

Figure 5:
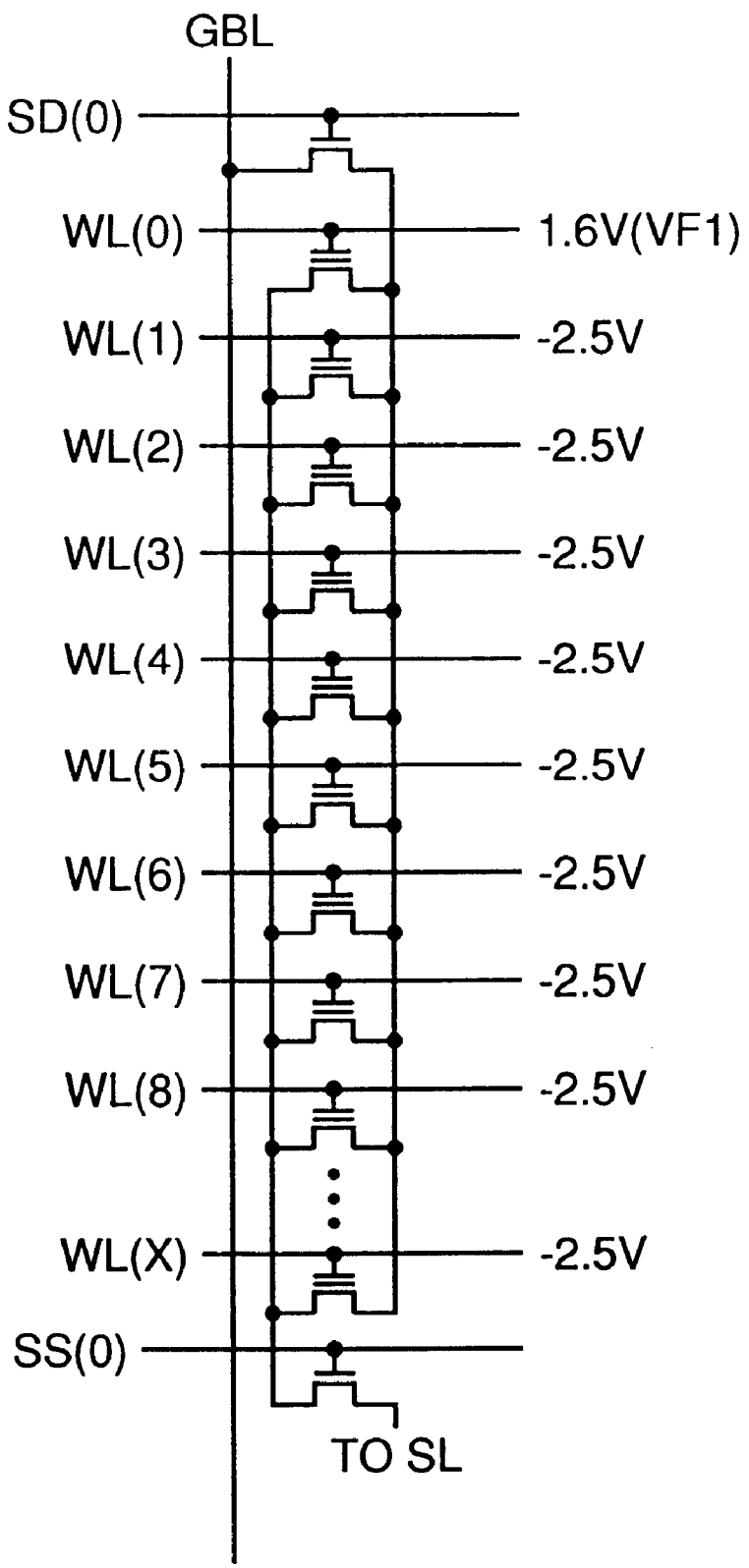
FIG. 5 is a schematic diagram shown in conjunction with the level of a potential to be applied to each word line in the physical block during erasing verify operation when it is determined that there is a memory cell in the deplete state.

FIG. 5 is a schematic diagram shown in conjunction with a potential to be applied to a word line in the physical block when erasing verify is performed on word line WL(0) with voltage VF0 of the non-selected word line being lower by 0.5 V than the initial set value since the depleted memory cell is found in the block to be erased during deplete check (S106).

Referring to FIG. 5, erasing verify voltage VF1 (=1.6 V) is applied to word line WL(0) which is subjected to erasing verify in the physical block, whereas updated voltage VF0 (=−2.5 V) of the non-selected word line is applied to the other word lines WL(1) to WL(X).

Returning to FIG. 2, the erasing verify operation is performed (a step S112) and, if it is determined that the erasing operation has not been completed, the process returns to S104.

On the other hand, if the result of the erasing verify on one sector is "pass," (a step S112) a determination is made as to if erasing verify on eight sectors has been completed (a step S114). If it is determined that the process on eight sectors has been completed, the sector address is reset again (a step S1012).

If it is determined that the process on eight sectors has not been completed, the sector address is incremented and the process returns to step S112.

Since the process of returning to step S1012 at which the sector address is reset is the same as in the conventional case described with reference to FIG. 24, and therefore description thereof will not be repeated.

The above described operation enables deplete check to be preliminary performed and the level of the voltage which is to be applied to the non-selected word line during erasing verify to be set at a suitable value. Thus, an erroneous result would not be produced by the erasing verify because of the memory cell in the deplete state.

Modification of the First Embodiment

In the erasing operation of the first embodiment described with reference to FIG. 2, if a memory cell of which threshold value is at least VF1 (for example 1.6 V) is found by erasing verify (S112), the result is "fail" and the process returns to step S104, where erasing pulses are further applied to eight sectors.

Then, in repeating deplete check, the voltage value used when the result of the previous deplete check is "pass" is directly used as the potential to be applied to the non-selected word line.

Figure 6:
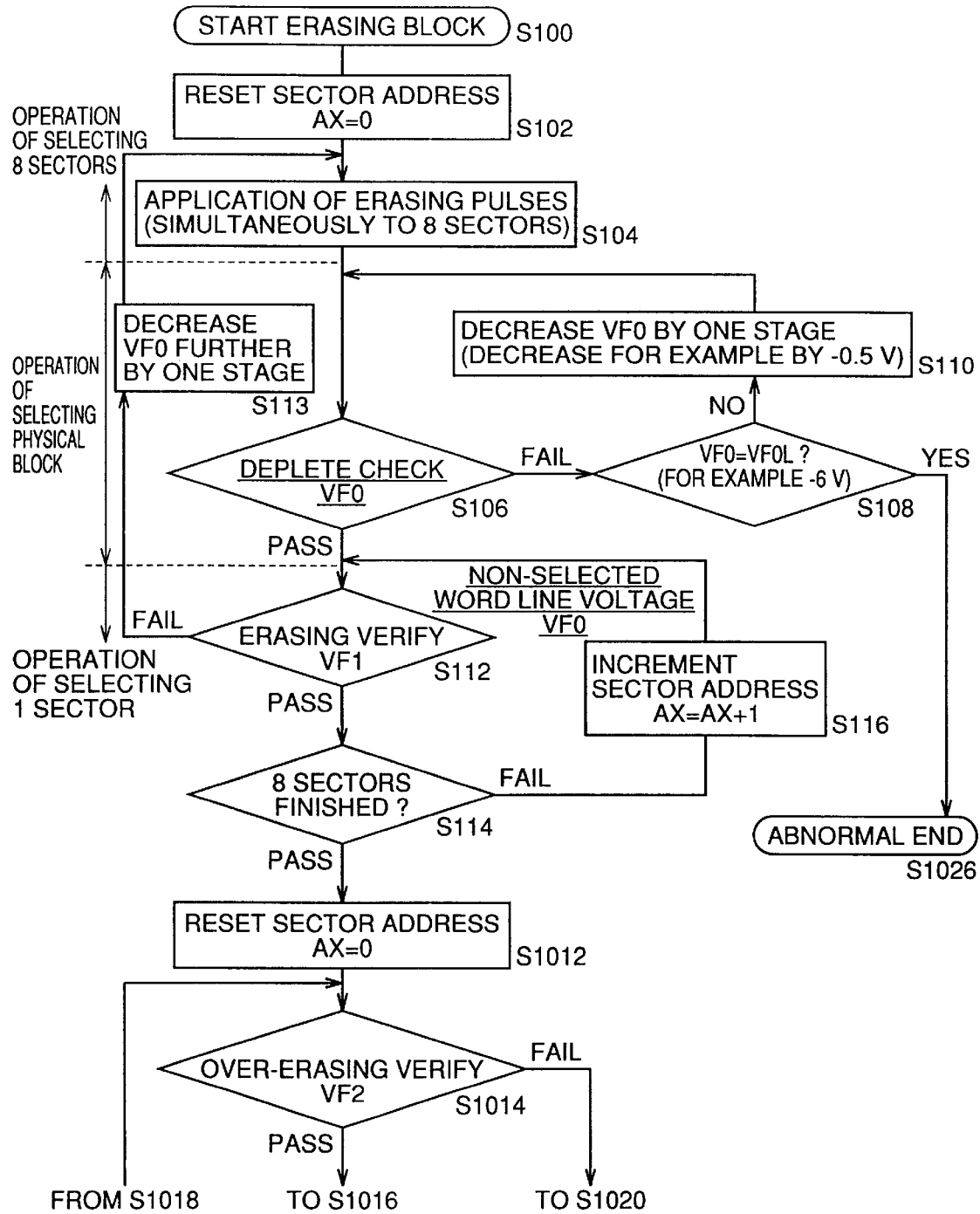
FIG. 6 is a flow chart shown in conjunction with the operation of a modification of the first embodiment of the present invention.

FIG. 6 is a flow chart shown in conjunction with the operation of the modification of the first embodiment of the present invention.

In the process shown in FIG. 6, deplete check (step S106) is performed after application of erasing pulses in step S104. Thus, if the result of the erasing verify (S112) is "fail," voltage VF0 of the non-selected word line can be set as a value determined by decreasing the voltage to be applied to the non-selected word line by a given amount, for example, 0.5 V.

Thus, potential VF0 to be applied to the non-selected word line is preliminary updated during deplete check when the result of the erasing verify (step S112) is "fail" so as to reduce the possibility that the determination result becomes "fail" again in the next deplete check.

The above mentioned process enables normal erasing verify even if there is a depleted cell of which threshold value has become equal to or smaller than −2 V.

In addition, since the voltage of the non-selected word line in the selected physical block is decreased only when there is a depleted cell, the device is disturbed for a less amount of time than when the non-selected word line is initially set at a low voltage during erasing verify.

Second Embodiment

Figure 7:
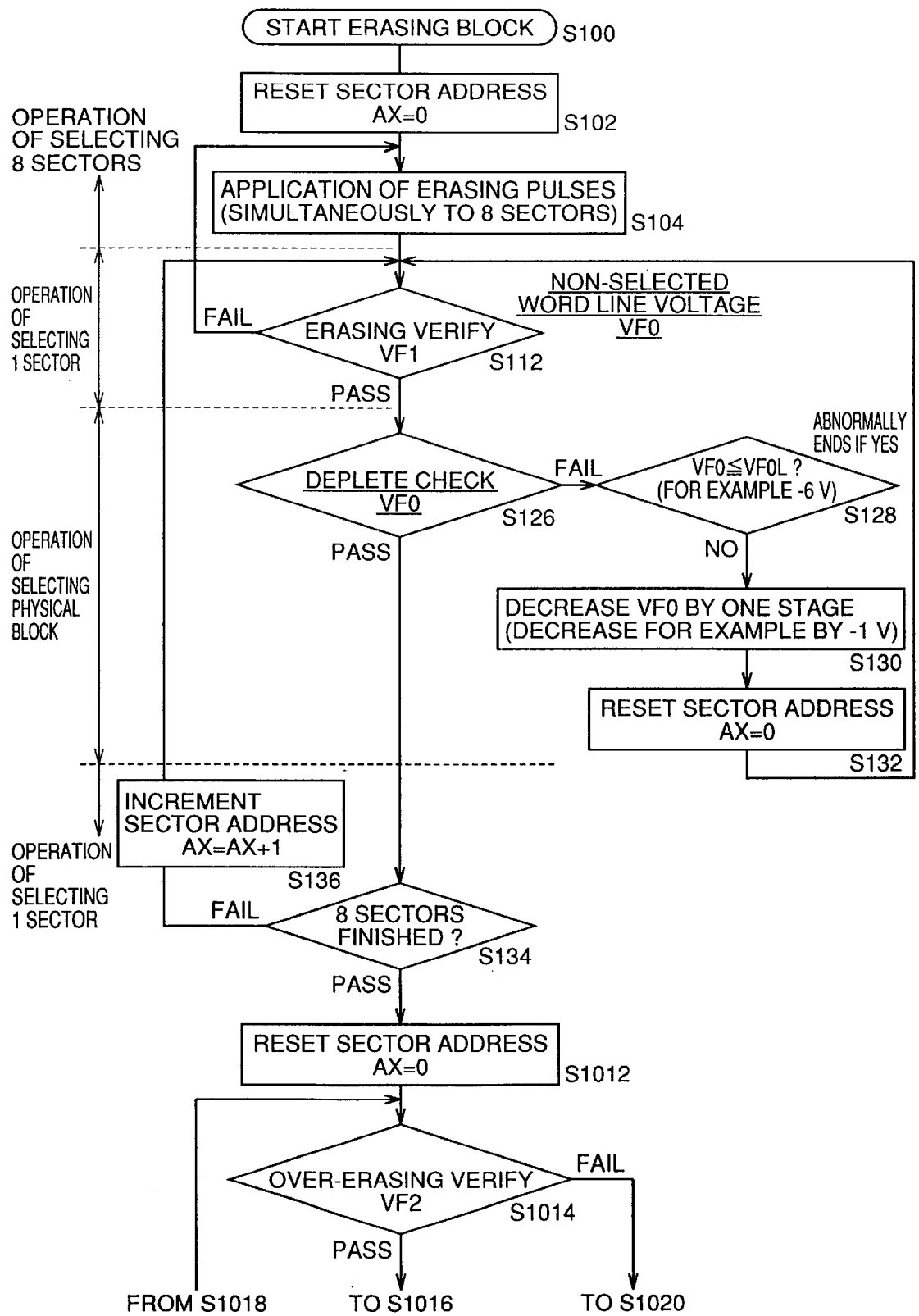
FIG. 7 is a flow chart shown in conjunction with the operation of block erasing of the second embodiment of the present invention.

FIG. 7 is a flow chart shown in conjunction with the operation of erasing a block of the second embodiment of the present invention.

It is noted that although the block to be erased will be described as having eight sectors also in the second embodiment, the number of sectors in the block to be erased is not limited to this and a greater or smaller number of sectors can be included.

In the first embodiment, the deplete check operation is performed before erasing verify operation.

In the second embodiment shown in FIG. 7, deplete check is performed every time the result of the erasing verify of the sector is "pass."

Namely, when the block erasing operation is started (a step S100), a sector address is reset (a step S102). Then, erasing pulses are applied simultaneously to eight sectors (a step S104).

Thereafter, the erasing verify operation is performed on one sector (a step S112).

In the erasing verify operation, if a fail bit is detected after performing erasing verify operation on one sector, the process returns to step S104.

On the other hand, if it is determined that the threshold value of the memory cell to be connected to the selected word line has become equal to or smaller than potential VF1 in the erasing verify operation, deplete check is successively performed in step S126.

If it is determined that a memory cell in a deplete state exists in the physical block based on the result of deplete check (step S126), successively, a determination is made as to if voltage VF0 of the non-selected word line has become equal to or smaller than the lowest value VF0L (step S128). If potential VF0 has not become equal to or smaller than the lowest value, voltage VF0 is decreased by a given amount (for example decreased by −1 V) (a step S130), the sector address is reset (a step S132), and the process returns to step S112.

If the result of the deplete check turns out to be "pass" in step S126, a determination is made as to if the process on the eight sectors has been completed (a step S134). If the process on the eight sectors has not been completed, the sector address is incremented by one and the process returns to step S112.

On the other hand, if it is determined that the process on the eight sectors has been completed (step S134), the sector address is reset (a step S1012).

Since the over-erasing verify operation is the same as the conventional erasing operation described in conjunction with FIG. 24, and therefore the description thereof will not be repeated.

The foregoing process allows the deplete check to be performed only when the result of the erasing verify is "pass," so that the deplete check is performed less frequently as compared with the case of the first embodiment in which the deplete check is performed before erasing verify. Thus, the time required for the erasing operation can be reduced.

Modification of Second Embodiment

Figure 8:
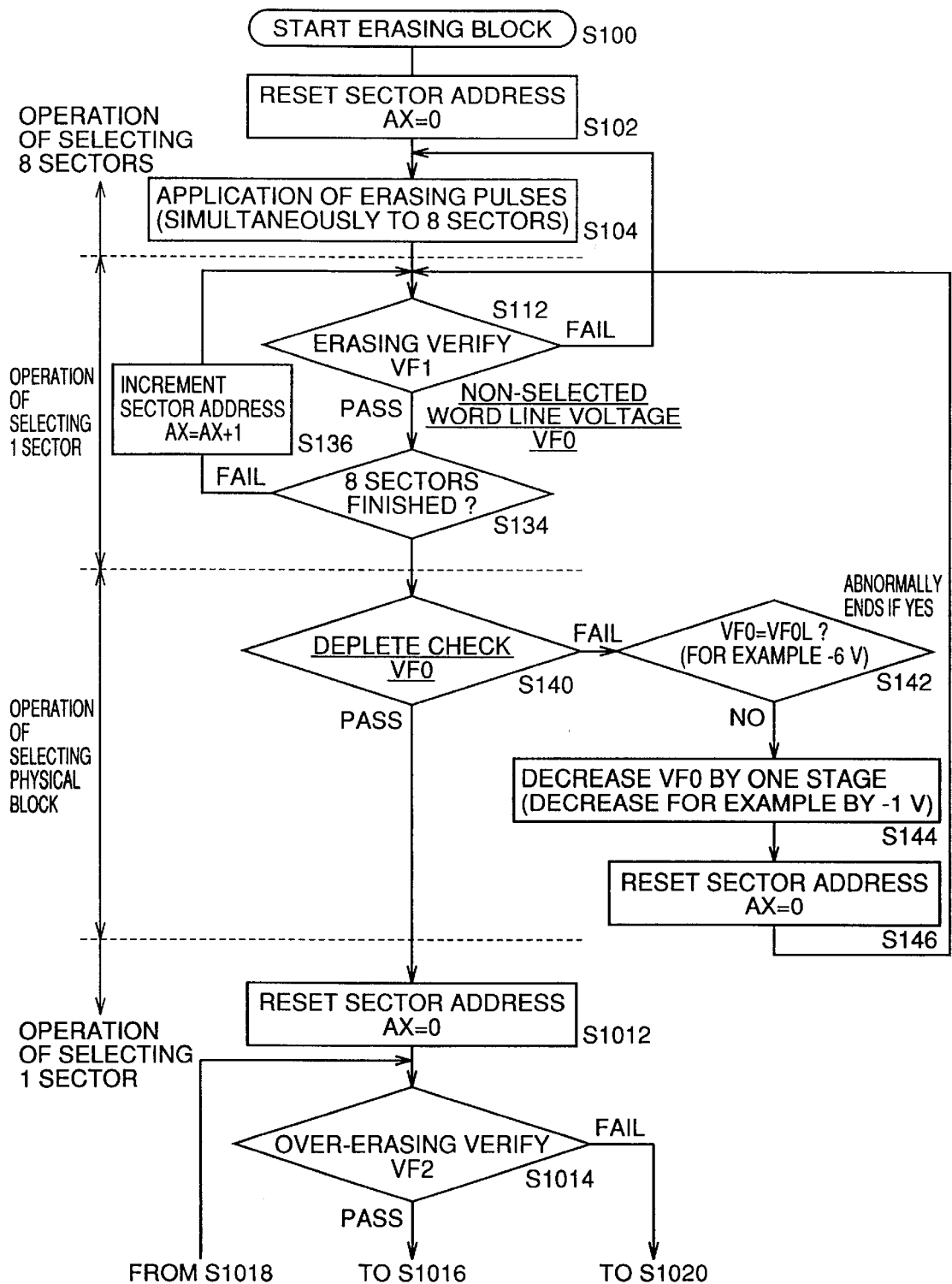
FIG. 8 is a flow chart shown in conjunction with a process of a modification of the second embodiment.

FIG. 8 is a flow chart shown in conjunction with a process of a modification of the second embodiment.

In the second embodiment, deplete check is performed every time the result of the erasing verify of one sector turns out to be "pass." On the other hand, in the modification of the second embodiment shown in FIG. 8, deplete check (a step S140) is performed after the result of the erasing verify on all of eight sectors turns out to be "pass." Namely, after the result of the erasing verify (step S112) turns out to be "pass" and it is determined that the process on the eight sectors has been completed (a step S134), deplete check (step S140) is performed and potential VF0 is reset (steps S142, S144, S146).

The above mentioned method also enables deplete check to be performed only when the result of the erasing verify turns out to be "pass." Thus, deplete check is performed less frequently as compared with the case where the deplete check is performed before the erasing verify as in the first embodiment. Accordingly, the time required for the erasing operation can be reduced.

Third Embodiment

Figure 9:
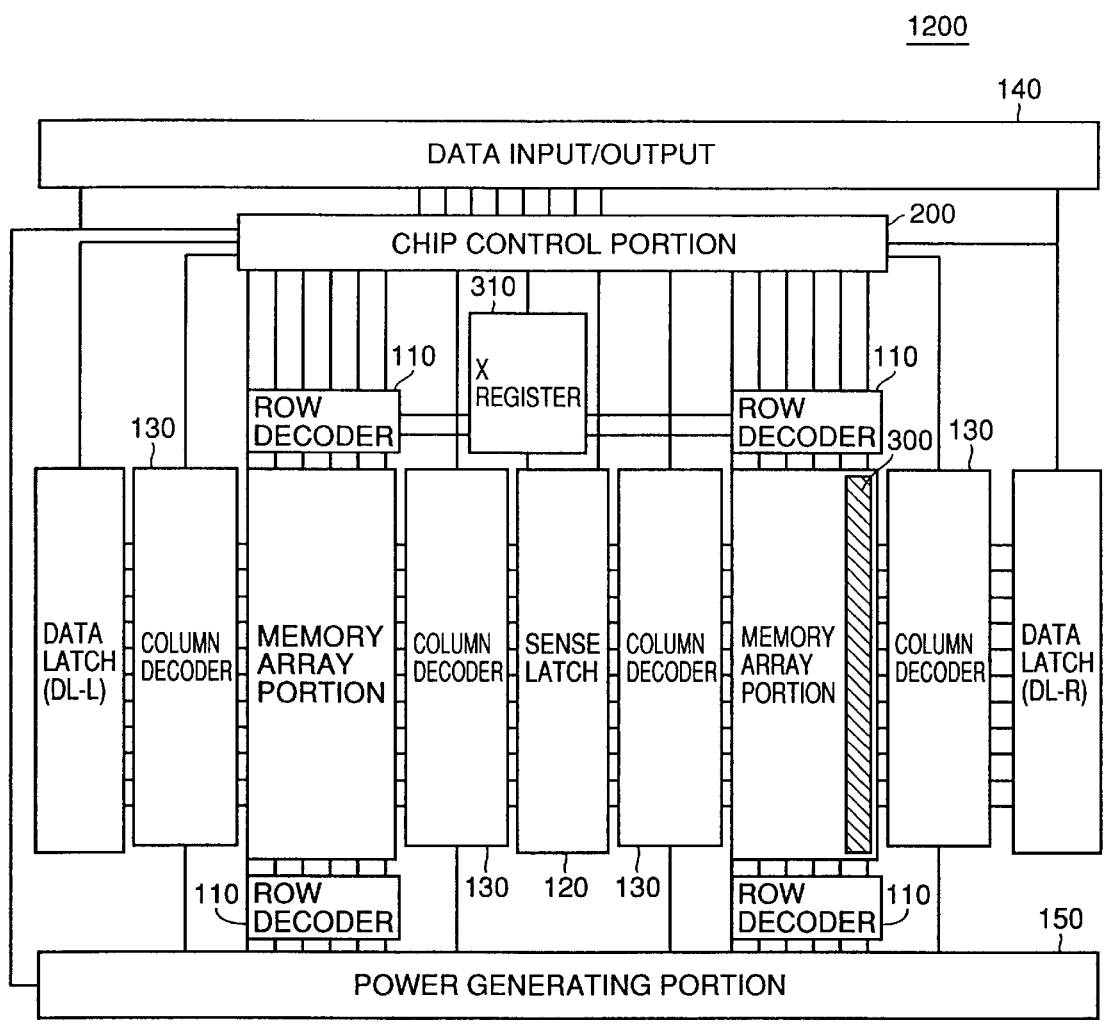
FIG. 9 is a schematic block diagram shown in conjunction with an arrangement of a flash memory 1200 of the third embodiment.

FIG. 9 is a schematic block diagram shown in conjunction with a structure of a flash memory 1200 of the third embodiment.

Unlike the structure of flash memory 1000 of the first embodiment shown in FIG. 1, a management sector 300 and an X register 310 are arranged. All the other parts are the same as flash memory 1000 shown in FIG. 1. Thus, the same portions are denoted by the same reference numerals and the description thereof will not be repeated.

Here, management sector 300 assures a part of a sector region for storage of specific information to prevent writing from an external system.

As will later be described in detail, a chip control portion 200 of flash memory 1200 reads information of management sector 300 in the memory array portion by a sense latch 120, stores information of a column address corresponding to the block to be erased in X register 310 and, determines if an erasing voltage is to be applied to each sector based on the information.

Figure 10:
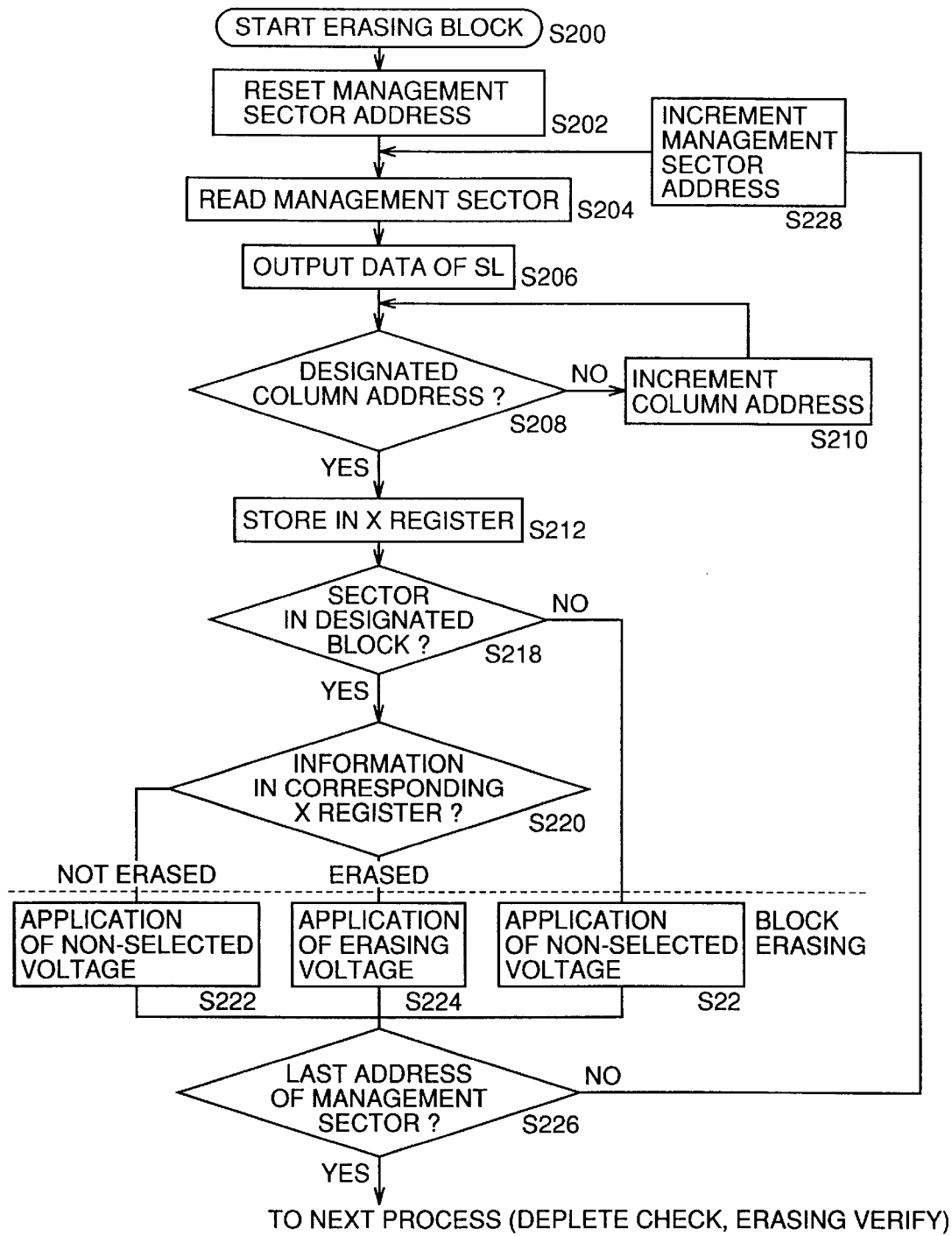
FIG. 10 is a flow chart shown in conjunction with a method of controlling application of an erasing voltage in block erasing of the third embodiment of the present invention.

FIG. 10 is a flow chart shown in conjunction with a method of controlling application of an erasing voltage during block erasing in the third embodiment of the present invention.

In the operation of the third embodiment shown in FIG. 10, an erasing voltage is applied for an adequate amount of time to every sector in consideration of an erasing characteristic of each sector.

The erasing characteristics of all sectors are preliminary measured. Information regarding to the erasing characteristics are written to the management sector in the memory array.

More specifically, referring to FIG. 10, when the block erasing is started (a step S100), the management sector address in chip control portion 200 is reset (a step S202).

Successively, a content of the management sector is read out and stored in sense latch SL (a step S204).

Thereafter, data of sense latch SL is output (a step S206), and a determination is made as to if it is a designated column address (the column address corresponding to the block to be erased) (a step S208).

If it is not the designated column address, the column address is incremented (a step S210), and the process returns to step S208.

On the other hand, if it is the designated column address (step S208), the value thereof is stored in the X register (a step S212).

Then, a determination is made as to if it is a sector in the designated block (the block to be erased) (a step S218) and, if it is not the sector in the designated block, a non-selected voltage is applied (a step S22).

If it is the sector in the designated block, information in the corresponding X register is read out. If the information in the corresponding X register is not to be erased, the non-selected voltage is applied to the corresponding word line (a step S222). On the other hand, if the information in the corresponding X register is to be erased, an erasing voltage is applied (a step S224).

Then, a determination is made as to if a management sector address is the last address (a step S226) and, if it is not the last address, the management sector address is incremented (a step S228) and the process returns to step S204.

If the management sector is at the last address, application of the erasing voltage ends. Successively, deplete check and erasing verify as described in the first or second embodiment are performed.

Figure 11:
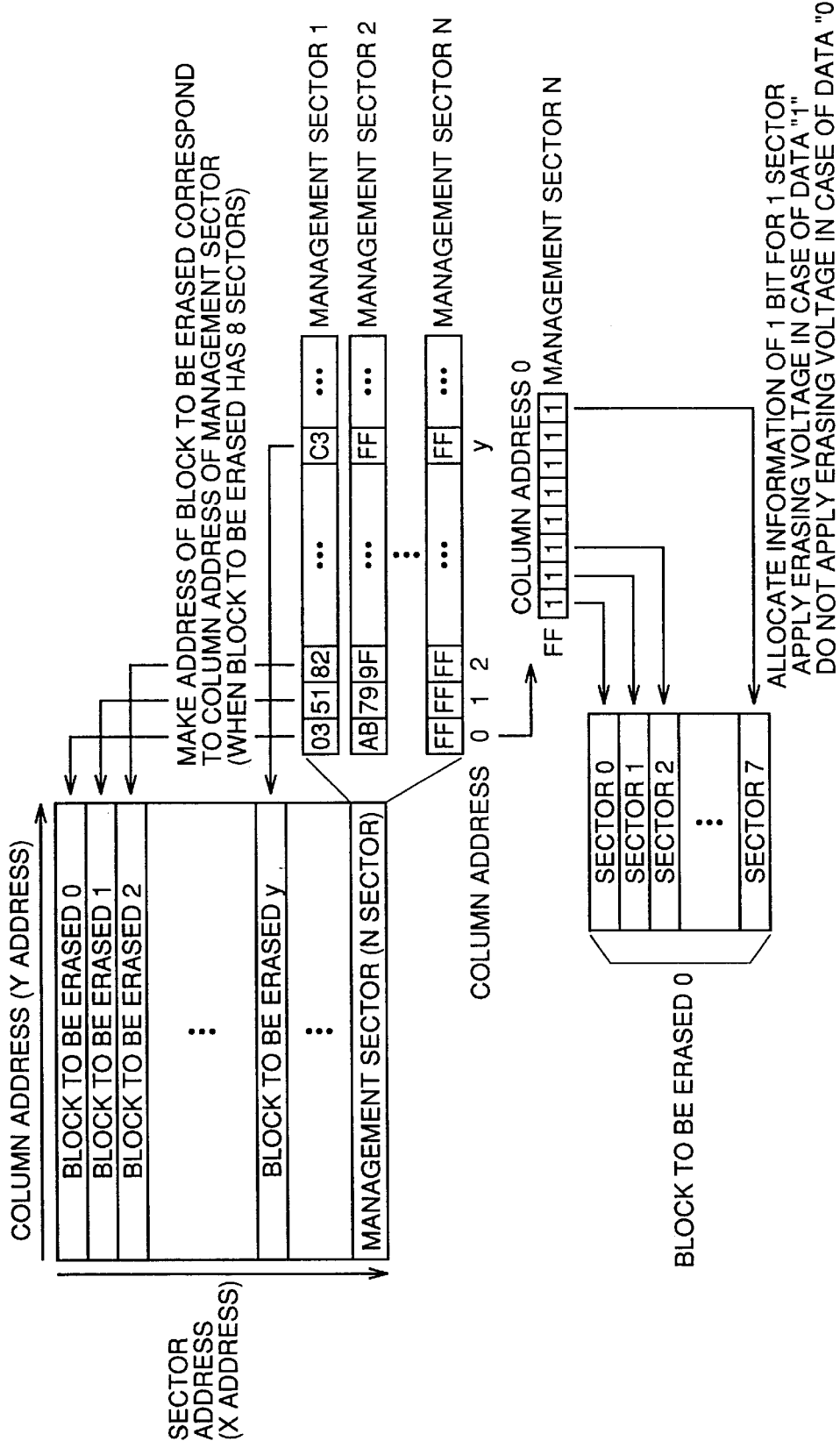
FIG. 11 is a schematic diagram showing an exemplary method of storing information to a management sector.

FIG. 11 is a schematic diagram showing an exemplary method of storing information to the management sector.

If the block to be erased has eight sectors, the addresses of the block to be erased 0, 1, . . . are made correspond to the column addresses of the management sector 0, 1, . . . , in a on-to-one correspondence, and the information of the eight sectors in the block to be erased are stored in one byte of the management sector.

Thus, the information for every sector can be stored in one bit. For example, if the block to be erased has 16 sectors, information may be recorded in 2 bytes of the management sector at one address of the block to be erased. In this manner, such storage of information is enabled regardless of the sector number of the block to be erased.

For information to be stored in the management sector, for example, the threshold values of the memory cells when a prescribed erasing pulse is applied are measured for every sector, and all sectors are classified into N groups. If there are groups 1, 2, . . . , N in an order of increasing speed of erasing, i.e., in an order of decreasing threshold value, "1" is stored in a bit corresponding to the sector belonging to the group 1 in "management sector 1" as shown in FIG. 11, and "0" is stored in a bit corresponding to the sector belonging to all the other groups.

In "management sector 2," "1" is stored in a bit corresponding to groups 1 and 2, and "0" is stored in a bit corresponding to all the other groups.

Similarly, "1" is stored in all bits of groups 1, 2, . . . , N in "management sector N."

Figure 12:
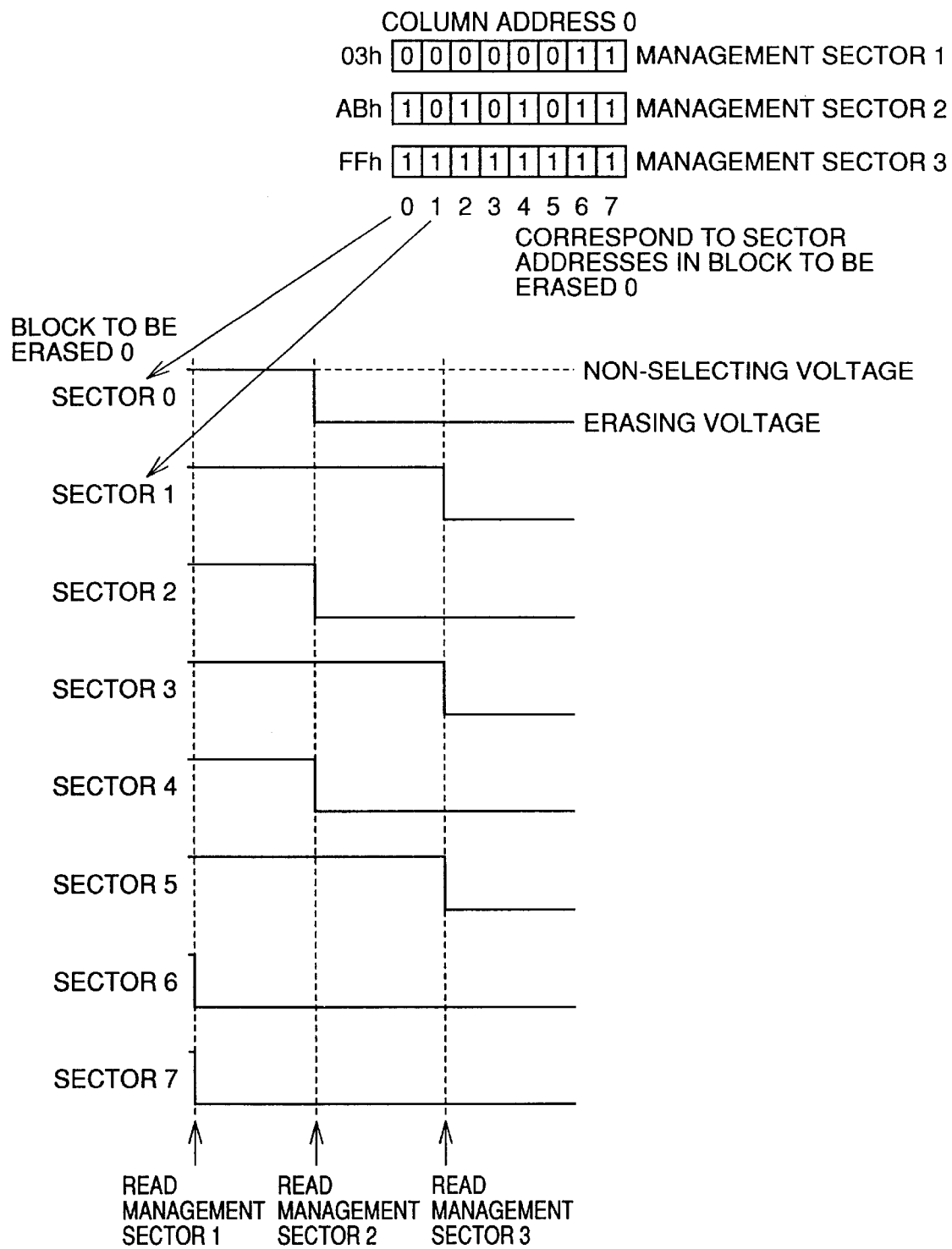
FIG. 12 is a graph showing a relationship between data stored in a management sector 300 and a voltage applied to each sector in the block to be erased.

FIG. 12 is a diagram showing a relationship between data stored in management sector 300 and a voltage to be applied to each sector in the block to be erased.

In block erasing, assume that if the bit in the management sector is "1," an erasing voltage is applied to the corresponding sector but not applied thereto if the bit in the management sector is "0." Then, in reading "management sector 1," an erasing voltage is applied only to the sectors (sectors 6 and 7) belonging to group 1 with the lowest speed.

Then, in reading "management sector 2," the erasing voltage is applied to the sectors (sectors 0, 2, 4, 6, 7) belonging to groups 1 and 2. Thus, the erasing voltage is applied for a longer period of time to the sectors with low erasing speed.

According to the above described method, even if there is a variation in the erasing a characteristics of the sectors, a distribution of the erasing speeds during block erasing can be reduced by controlling the time for application of the erasing voltage. Thus, the problem associated with deplete can be alleviated.

Modification of Third Embodiment

Figure 13:
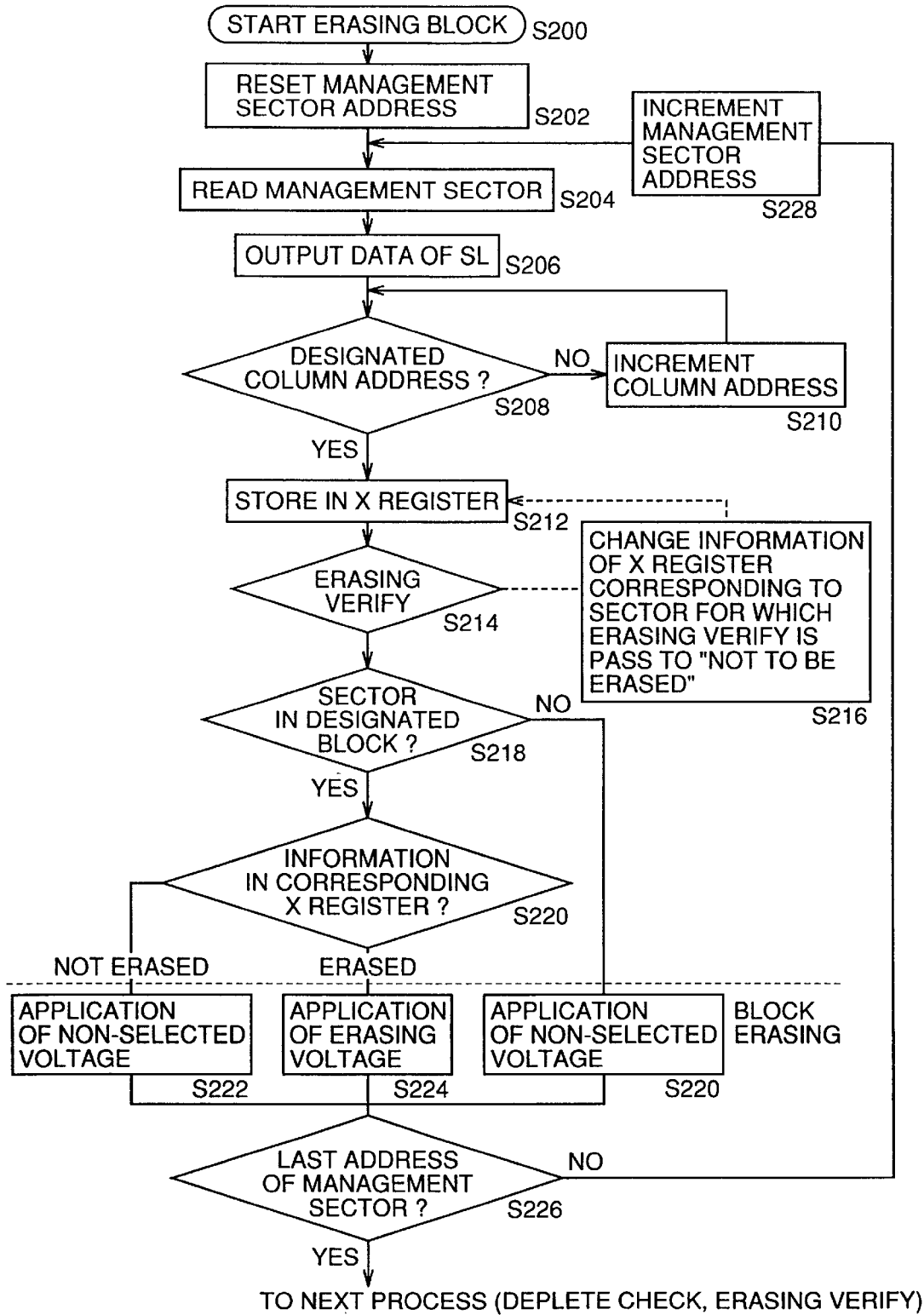
FIG. 13 is a flow chart shown in conjunction with a method of controlling application of an erasing voltage in block erasing of a modification of the third embodiment.

FIG. 13 is a flow chart shown in conjunction with a method of controlling application of the erasing voltage during block erasing in a modification of the third embodiment.

In the process shown in FIG. 13, in addition to the process shown in FIG. 10, erasing verify is performed before application of the erasing voltage. For the sector which has initially been in the erasing state, information of the corresponding X register 310 is changed from "1" to "0," so that application of the erasing voltage is forcibly avoided.

More specifically, after data is stored in the X register (a step S212), an erasing verify operation is performed (a step S214). If the result of the erasing verify is "pass," the information of the X register corresponding to the "passed" sector is changed to a "not to be erased" state (a step S216).

On the other hand, if the result of the erasing verify is not "pass," the process proceeds to a step S218.

According to the above described method, similarly, even if there is a variation in the erasing characteristics of the sectors, a distribution of the erasing time of the blocks to be erased can be reduced by controlling the time for application of the erasing voltage. Thus, the problem associated with deplete can be alleviated.

Fourth Embodiment

Figure 14:
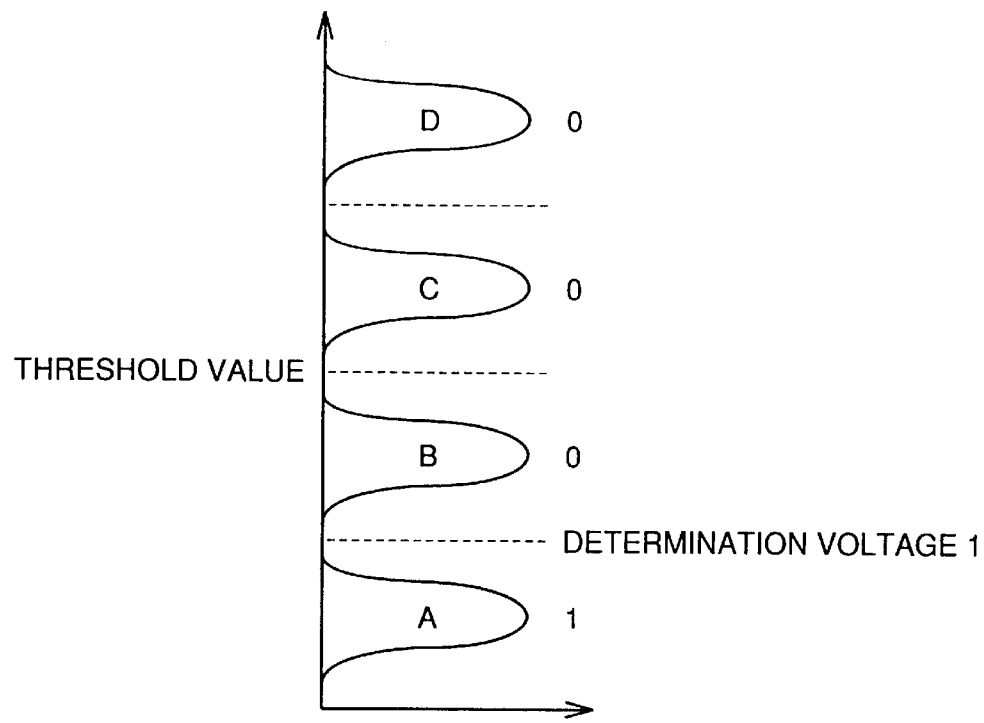
FIGS. 14 to 16 are respectively first to third schematic diagrams showing a method of storing information related to an erasing voltage in block erasing in a multiple-level memory having a plurality of threshold value levels for one memory cell.
Figure 15:
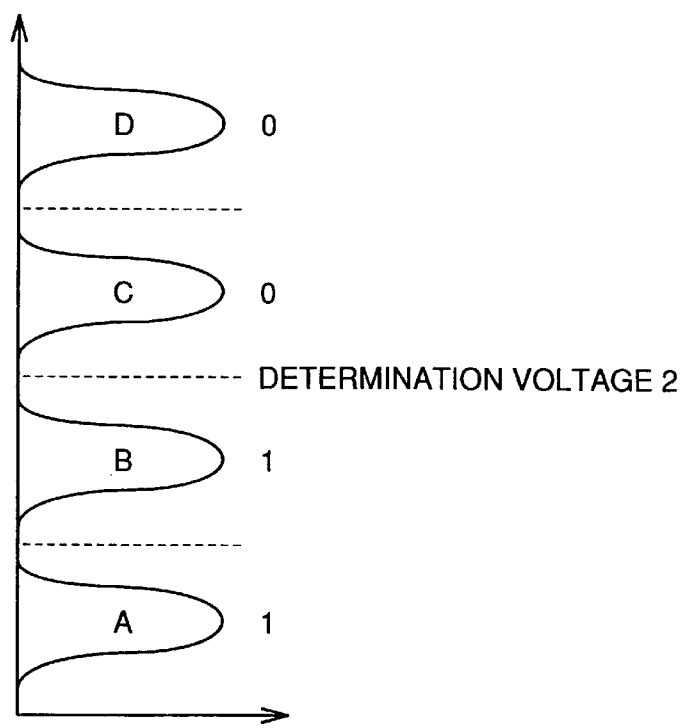
Figure 16:
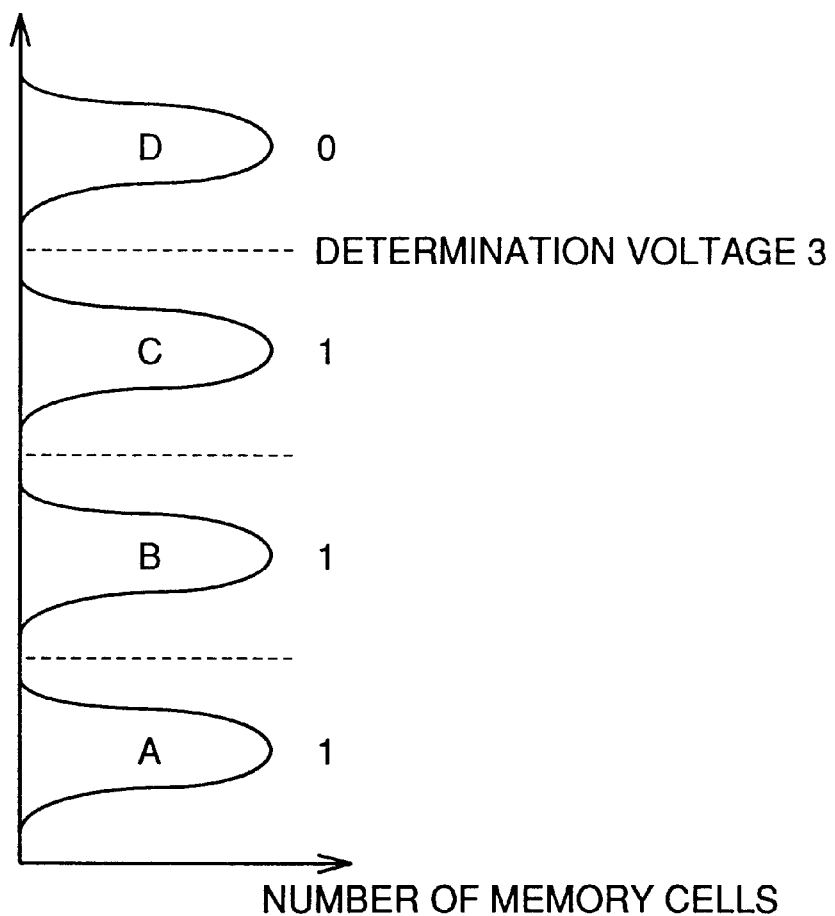

FIGS. 14 to 16 are schematic diagrams showing exemplary methods of storing information related to an erasing voltage during block erasing in a multiple-level memory having a plurality of threshold value levels for one memory cell.

In the third embodiment, information related to the application of the erasing voltage to one sector is made correspond to one bit of the management sector. However, in the present embodiment, it is made correspond to one memory cell of the management sector of the multiple-level memory.

FIGS. 14 to 16 show distributions of threshold values when a multiple-level number is 4.

Referring to FIG. 14, assume that reading is performed with a determination voltage 1, "1" is read out from the memory cell of which threshold value falls within a distribution A, and "0" is read out from the cell in all the other distributions. Then, an erasing voltage is applied only to a sector corresponding to the memory cell of which reading result is "1."

Referring to FIG. 15, similarly, reading is performed with a determination voltage 2, and the erasing voltage is applied to the sector corresponding to the memory cell of which threshold value falls within distributions A and B. Further, referring to FIG. 16, reading is performed with determination voltage 3, and the erasing voltage is applied to the sector corresponding to the memory cell of which threshold value is in distributions A, B and C.

Namely, by changing the determination voltage of the multiple-level memory rather than incrementing the management sector address in FIG. 10, information to be stored in X register 310 is updated.

This method is not only applied to the flash memory which controls all memory regions by multiple values but to any device which can control the distribution of threshold values by multiple values only for the management sector.

Fifth Embodiment

Figure 17:
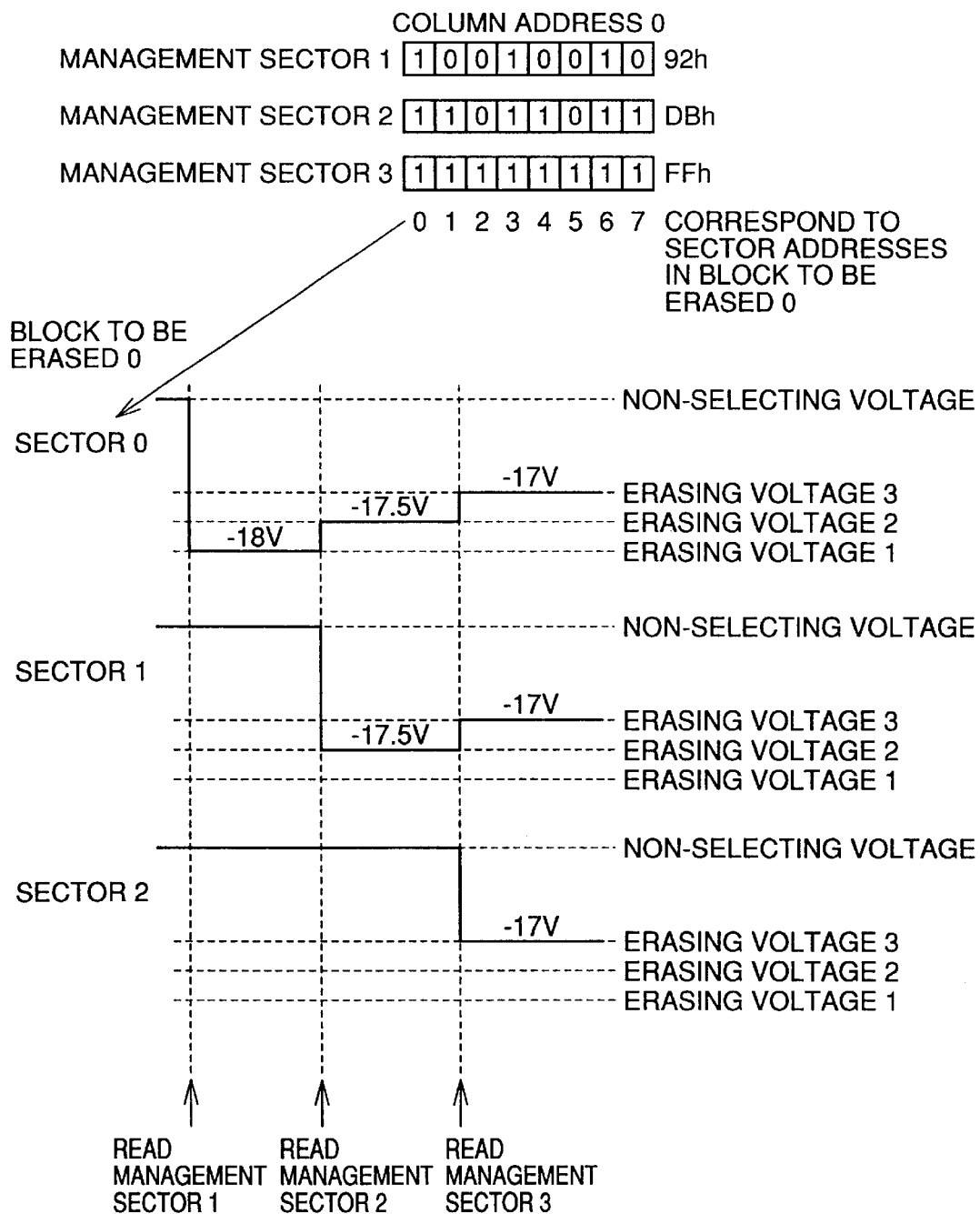
FIG. 17 is a schematic diagram shown in conjunction with a method of controlling application of an erasing voltage in the fifth embodiment of the present invention.

FIG. 17 is a schematic diagram shown in conjunction with a method of controlling application of an erasing voltage according to the fifth embodiment of the present invention.

In the third and fourth embodiments, the time for application of the erasing voltage to each sector in the block to be erased is controlled. However, the present embodiment controls a value of the erasing voltage per se for every sector.

In the example shown in FIG. 17, information is stored with one bit of the management sector being corresponding to one sector to which the erasing voltage is applied when the block to be erased has eight sectors. It is noted that, as in the case of the fourth embodiment, it can be made correspond to one memory cell of the multiple-level memory.

Referring to FIG. 17, the erasing characteristics of all sectors are preliminary measured. For example, each of N erasing pulsewise voltages applied for a prescribed period of time, and a determination is made as to if deplete is caused to classify all sectors into N groups.

The sectors of which erasing speed is the lowest, i.e., the sectors which do not deplete even if a high erasing voltage (of for example −18 V) is applied as an absolute value are classified as groups 1, 2, . . . , N. In this case, "1" is stored only in a bit corresponding to the sector belonging to group 1 in "management sector 1" shown in FIG. 17.

Similarly, "1" is stored in a bit corresponding to groups 1 and 2 in "management sector 2."

Assume that if "1" is stored in the bit in the management sector, the erasing voltage is applied to the corresponding sector corresponding and if the bit in the management sector is "0" the erasing voltage is not applied. Then, erasing voltage 1 is applied only to the sector belonging to group 1 when reading "management sector 1," and erasing voltage 2 is applied to the sector belonging to groups 1 and 2 when reading "management sector 2."

For example, by setting erasing voltages 1, 2, . . . , N to −18 V, −17.5 V, . . . (−18 +0.5 (N−1)) V, respectively, the erasing voltage which is high in absolute value is applied to the sector with low erasing speed, and an excessively high voltage would not be applied to the sector with high erasing speed which tends to be depleted.

According to the method, by applying a suitable erasing voltage to each sector in the block to be erased, the time required for erasing the block can be reduced as compared with the case of the third and fourth embodiments.

Sixth Embodiment

Figure 18:
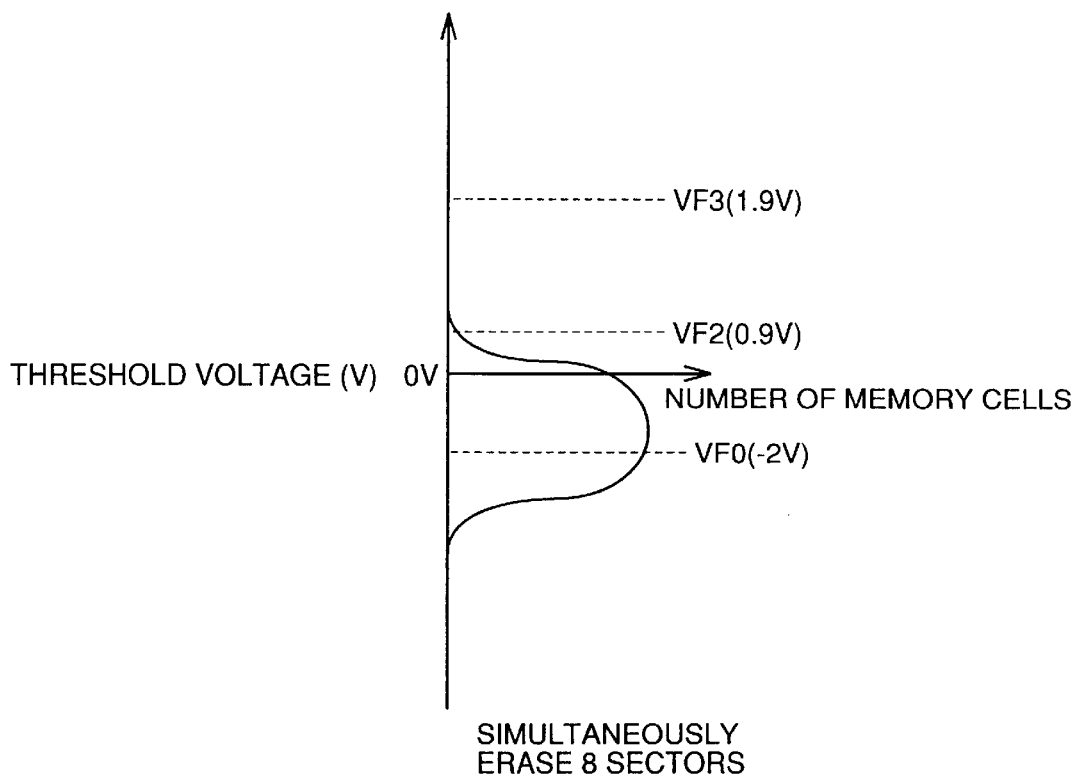
FIGS. 18 to 20 are respectively first to third schematic diagrams showing a method of controlling a threshold value voltage in the present invention.
Figure 19:
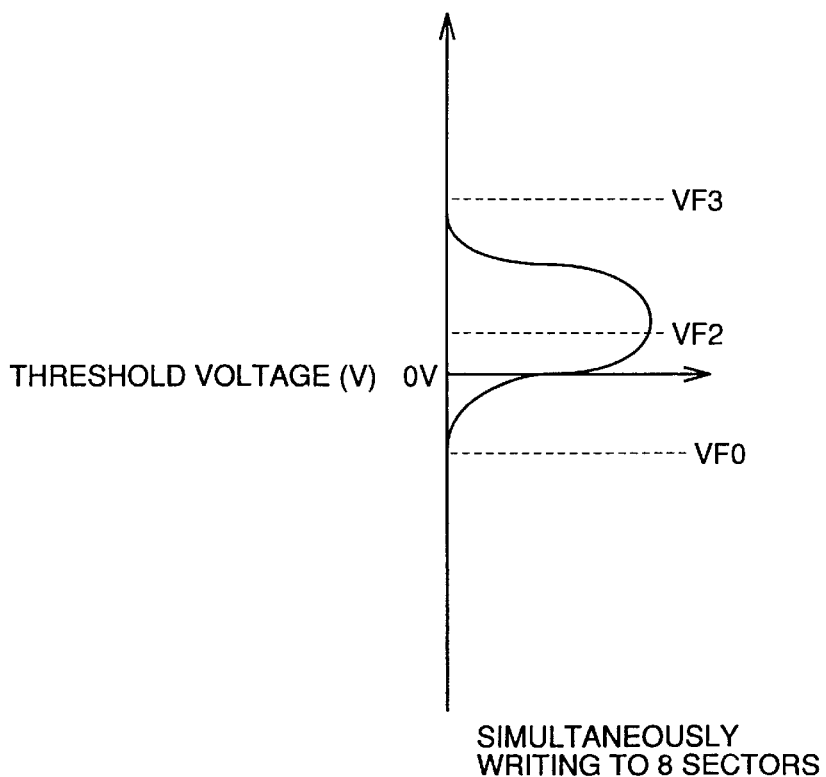
Figure 20:
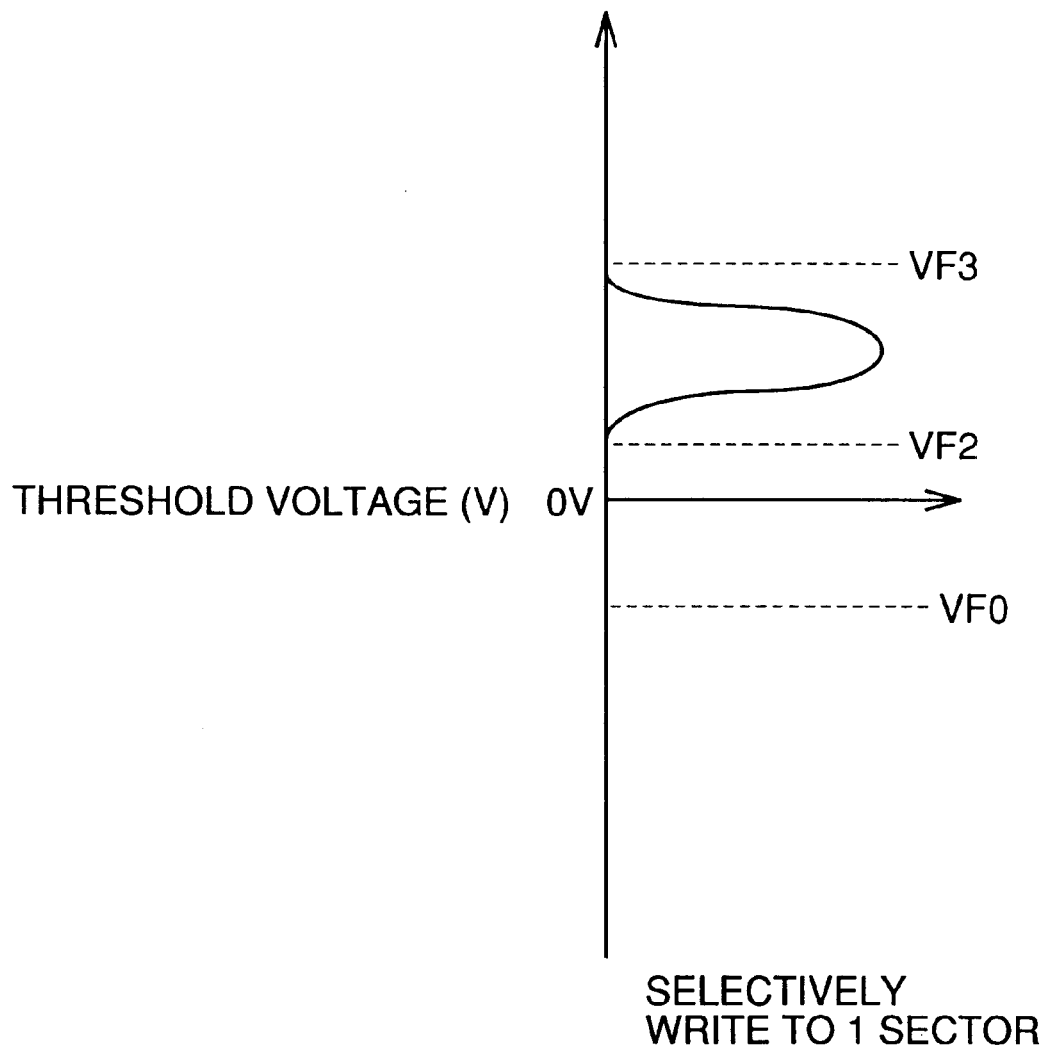

FIGS. 18 to 20 are schematic diagrams showing exemplary methods of controlling threshold voltages of the present invention.

In the sixth embodiment, after the threshold value of the memory cell is decreased to a value lower than that when erasing one sector in applying the erasing voltage to the block to be erased, the threshold value of the memory cell is increased to a desired threshold value by a writing operation.

Figure 21:
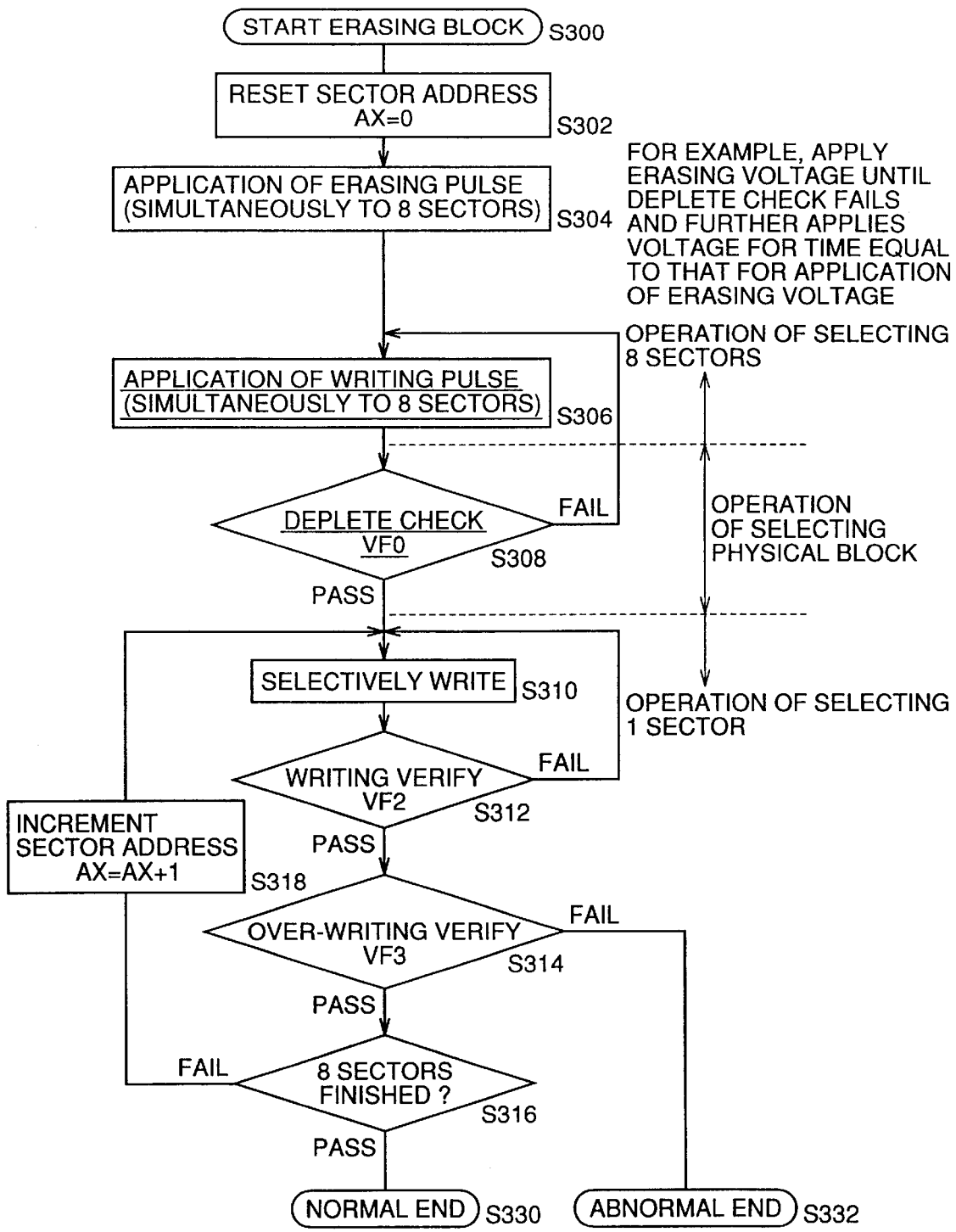
FIG. 21 is a flow chart shown in conjunction with an operation of the sixth embodiment.
Figure 22:
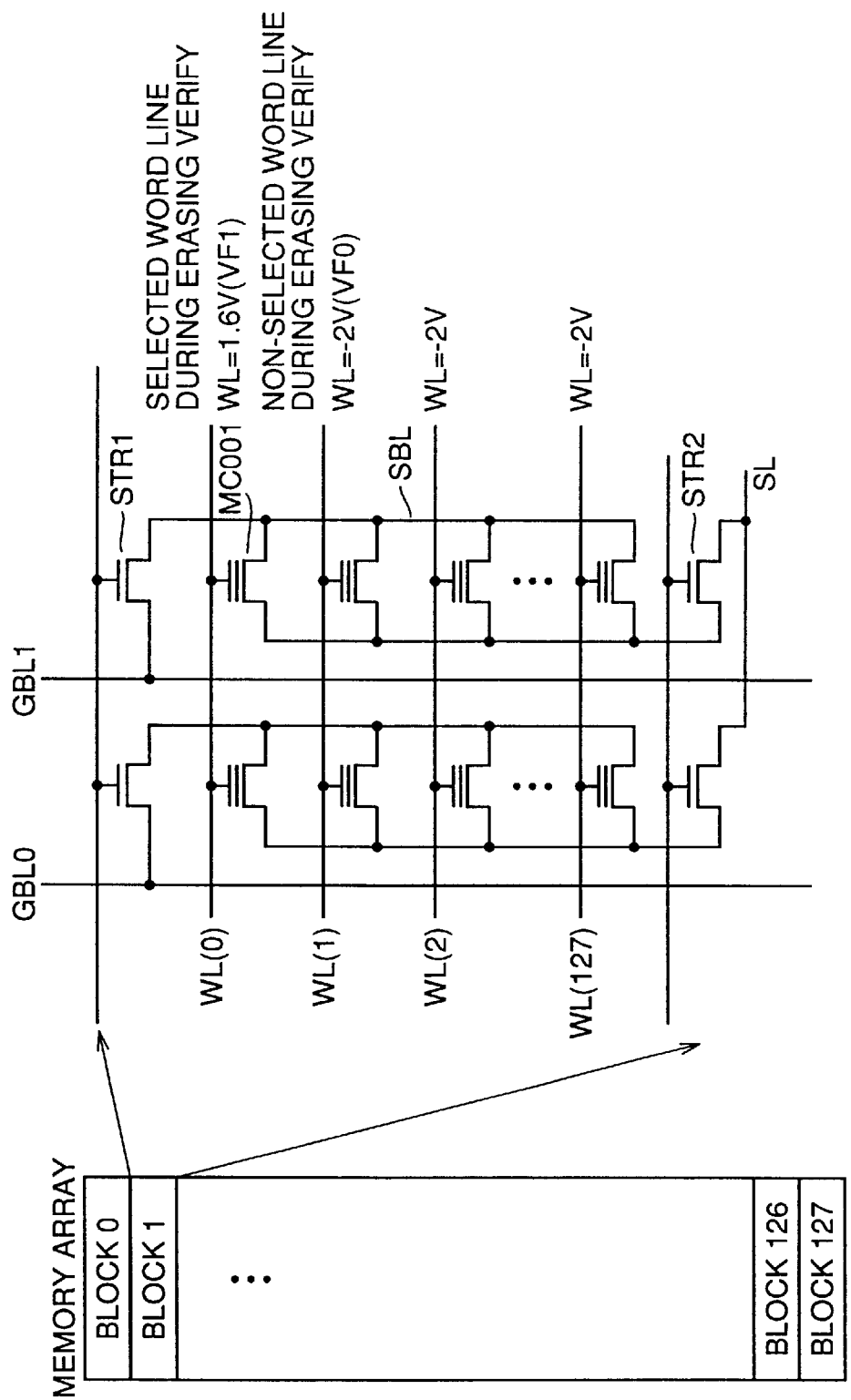
FIG. 22 is a schematic block diagram showing an arrangement of a memory cell array of an AND flash memory.
Figure 23:
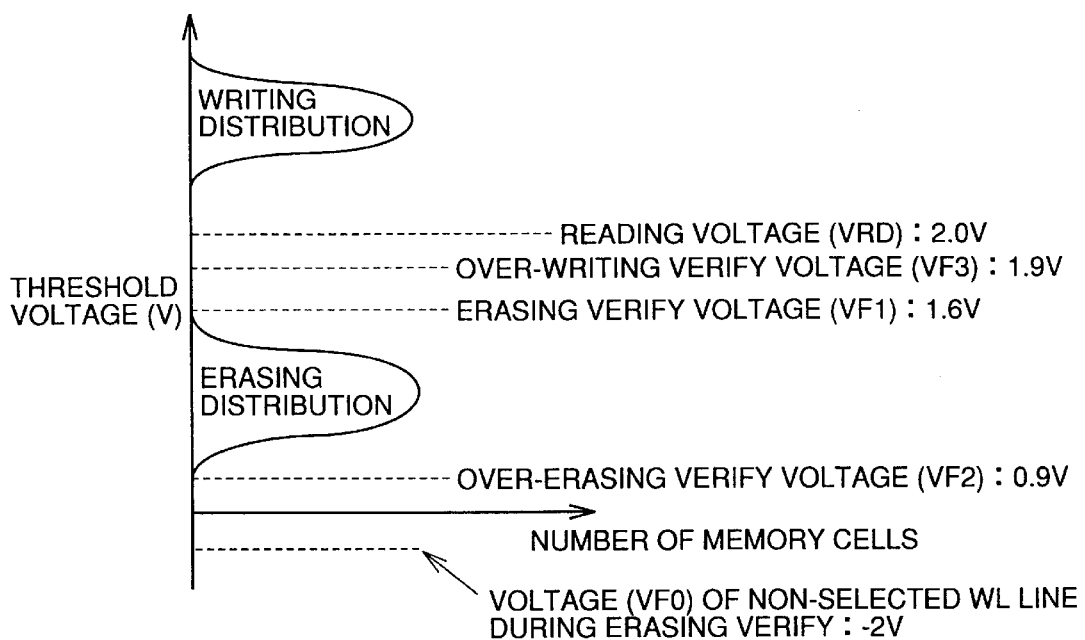
FIG. 23 is a graph showing a relationship between a distribution of threshold values of the memory cell transistors in the block to be erased and a verify voltage in block erasing.

FIG. 21 is a flow chart shown in conjunction with the operation of the sixth embodiment.

Here, the description will be given assuming that the block has eight sectors.

Referring to FIGS. 18 to 21, first, when the block erasing operation is started (a step S300), the sector address is reset (a step S302). Thereafter, erasing pulses are applied simultaneously to eight sectors (a step S304). For example, deplete check as described in the first embodiment (voltages VF0 of all word lines: for example at −2 V) is performed after application of the erasing voltage and, if there is any memory cell of which threshold value is equal to or smaller than VF0, the erasing voltage is further applied for a period of time equal to that spent for application of the voltage so far. The distribution of the threshold values at the time is as shown in FIG. 18.

Then, a writing voltage is applied simultaneously to eight sectors (a step 306), and deplete check is performed (a step S308).

The simultaneous writing to the eight sectors is repeated until the threshold values of all memory cells become equal to or greater than VF0 and the result of the deplete check turns out to be "pass." The distribution of the threshold values in this state can be depicted as shown in FIG. 19.

If the sector with low erasing speed has a low writing speed, a distribution width during application of the writing voltage is smaller than the distribution of the threshold values during application of the erasing voltage.

When the result of the deplete check is "pass" (a step S308), a selectively performed writing (a step 310) and writing verify (a step S312) are repeated for every block. Thus, the threshold values of all memory cells in the selected sector are increased at least to VF2. The distribution of the threshold values of the cells in this case is depicted as shown in FIG. 20.

Eventually, a determination is made as to if there is any memory cell of which threshold value has become equal to or greater than VF3 by over-writing verify (a step 314). If the result of the over-writing verify turns out to be "pass," a determination is made as to if a process on eight sectors has been completed (a step S316). If the result of the over-writing verify is "fail," the process abnormally ends (a step S332).

When the result of the over-writing verify is "pass," if the process on the eight sectors has not been completed, the sector address is incremented and the process returns to step S310.

On the other hand, if it is determined that the process on the eight sectors has been completed, (a step S316), the operation ends (a step S330).

According to the method as described above, even if the memory cell is brought into a deplete state by application of the erasing voltage, the block can normally be erased. Further, the operation can be performed at a higher speed than in the case of repeating the selectively performed writing and writing verify for every sector because of simultaneous writing to the plurality of sectors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor device, comprising:
   a memory cell array having a plurality of memory cells arranged in a matrix, each of said memory cells including a memory cell transistor capable of changing a threshold value in accordance with an applied control potential;
   a plurality of bit lines arranged corresponding to columns of said memory cell array for transmitting data stored in said memory cell transistors;
   a plurality of word lines arranged corresponding to rows of said memory cell array for transmitting said control potential and reading potential to said memory cell transistor;
   a data detection circuit for detecting said stored data read out through said bit line;
   an internal power supply circuit capable of generating said control potential for an erasing operation on said stored data of said memory cells and variably generating a first potential applied to a selected memory cell and a second potential applied to non-selected memory cells during a reading operation;
   a selection circuit for selectively supplying a potential generated by said internal power supply circuit to said memory cells; and
   an internal control circuit controlling an operation of said nonvolatile semiconductor memory device and controlling said selection circuit for selectively applying said control potential to each block to be erased,
   said block to be erased including said plurality of memory cells connected to a prescribed number of word lines out of said plurality of word lines, and
   said internal control circuit updating said second potential in such a way that said second potential can render nonconductive said memory cells belonging at least to said block to be erased, and verifying erasing based on the detection result of said data detection circuit by selectively applying said first potential to one of said word lines in said block to be erased and applying the updated second potential to the remaining word lines in said block to be erased.

2. The nonvolatile semiconductor memory device according to claim 1, wherein said internal control circuit applies said control potential collectively to said block to be erased, updates said second potential in such a way that said second potential can render nonconductive said memory cells belonging at least to said block to be erased, verifies erasing by applying said first potential and said updated second potential to said memory cell in said block to be erased, and repeats application of said control potential and updating of said second potential collectively with respect to said block to be erased until said erasing operation on said memory cells in said block to be erased is completed.

3. The nonvolatile semiconductor memory device according to claim 1, wherein said internal control circuit applies said control potential collectively to said block to be erased, updates said second potential in such a way that said second potential can render nonconductive said memory cells belonging at least to said block to be erased is conductive, verifies erasing by applying said first potential and said updated second potential to said memory cell in said block to be erased and, if erasing has not been completed, updates said second potential by a prescribed amount, and repeats application of said control potential and updating of said second potential collectively with respect to said block to be erased until said erasing operation on said memory cells in said block to be erased is completed.

4. The nonvolatile semiconductor memory device according to claim 1, wherein said internal control circuit applies said control potential collectively to said block to be erased, verifies erasing by applying said first potential and said second potential to said memory cell in said block to be erased, repeats application of said control potential collectively to said block to be erased until said erasing operation on said memory cell in said block to be erased is completed, updates said second potential in such a way that said second potential can render nonconductive said memory cells belonging at least to said block to be erased is conductive, and repeats application of said control potential, verification of said erasing and updating of said second potential collectively with respect to said block to be erased until said erasing operation on said memory cell in said block to be erased is completed.

5. The nonvolatile semiconductor memory device according to claim 1, further comprising a storage circuit for storing erasing characteristics preliminary measured for the plurality of memory cell transistors connected to respective word lines in said block to be erased, wherein
   said internal control circuit controls said control potential applied for every block to be erased based on data stored in said storage circuit for every word line in said block to be erased.

6. The nonvolatile semiconductor memory device according to claim 5, wherein said storage circuit includes a prescribed number of memory cells in said memory cell array.

7. The nonvolatile semiconductor memory device according to claim 6, wherein said internal control circuit controls a time for application of said control potential to said block to be erased based on data stored in said storage circuit for every word line in said block to be erased.

8. The nonvolatile semiconductor memory device according to claim 6, wherein said internal control circuit controls a potential level of said control potential applied to said block to be erased based on data stored in said storage circuit for every word line in said block to be erased.

9. The nonvolatile semiconductor memory device according to claim 5, wherein said each memory cell transistor can store multiple values, and said storage circuit includes a prescribed number of memory cells in said memory cell array.

10. The nonvolatile semiconductor memory device according to claim 9, wherein said internal control circuit controls a time for application of said control potential to said block to be erased is applied based on data stored in said storage circuit for every word line in said block to be erased.

11. The nonvolatile semiconductor memory device according to claim 9, wherein said internal control circuit controls a potential level of said control potential applied to said block to be erased based on data stored in said storage circuit for every word line in said block to be erased.

12. The nonvolatile semiconductor memory device according to claim 1, wherein said internal power supply circuit is further capable of generating a writing potential required for writing to said memory cell, and
   said internal control circuit controls said selection circuit for selectively applying said control potential for every block to be erased until any of said memory cells in said block to be erased is rendered conductive and applying said writing potential to said memory cell transistor in said block to be erased after further applying said control potential to every block to be erased to equalize said control potential with a threshold value during erasing operation.

13. The nonvolatile semiconductor memory device according to claim 12, wherein said internal control circuit controls said selection circuit for selectively applying said control potential to every block to be erased until any of said memory cell in said block to be erased is rendered conductive and applying said writing potential to said memory cell transistor in said block to be erased after further applying said writing potential to said block to be erased, and further applying said writing potential to every word line in said block to be erased so as to equalize said writing potential with a threshold value during said erasing operation.

* * * * *